(12) United States Patent
Kubota

(10) Patent No.: US 7,368,182 B2
(45) Date of Patent: May 6, 2008

(54) HARD COATING AND ITS FORMATION METHOD, AND HARD-COATED TOOL

(75) Inventor: Kazuyuki Kubota, Chiba-ken (JP)

(73) Assignee: Hitachi Tool Engineering, Ltd., Tokyo (JP)

( * ) Notice: Subject to any disclaimer, the term of this patent is extended or adjusted under 35 U.S.C. 154(b) by 0 days.

(21) Appl. No.: 11/055,718

(22) Filed: Feb. 11, 2005

(65) Prior Publication Data

US 2005/0238890 A1 Oct. 27, 2005

(30) Foreign Application Priority Data

| Feb. 12, 2004 | (JP) | ............................. 2004-034515 |
| Oct. 27, 2004 | (JP) | ............................. 2004-312731 |
| Jan. 17, 2005 | (JP) | ............................. 2005-008571 |

(51) Int. Cl.
*C23C 14/00* (2006.01)

(52) U.S. Cl. ..................... 428/697; 51/307; 51/309; 428/336; 428/698; 428/699

(58) Field of Classification Search ............... 428/697, 428/698, 699, 704, 336; 51/307, 309
See application file for complete search history.

(56) References Cited

U.S. PATENT DOCUMENTS

| 5,843,533 A | 12/1998 | Besmann et al. |
| 6,521,349 B1 | 2/2003 | Konig et al. |
| 6,528,171 B1 | 3/2003 | Endler et al. |
| 6,565,957 B2 * | 5/2003 | Nakamura et al. ........... 428/216 |
| 6,824,601 B2 * | 11/2004 | Yamamoto et al. ....... 106/286.2 |

FOREIGN PATENT DOCUMENTS

| DE | 199 57 668 A1 | 9/2000 |
| FR | 1060337 | 1/1954 |
| GB | 2303380 A | 2/1997 |
| JP | 05-239618 | 9/1993 |
| JP | 07-205362 | 8/1995 |
| JP | 08-127863 | 5/1996 |
| JP | 09-295204 | * 11/1997 |
| JP | 2000-326108 | * 11/2000 |
| JP | 2001-121315 | 5/2001 |
| JP | 2001-293601 | 10/2001 |
| JP | 2001-328009 | 11/2001 |
| JP | 2003-225807 | 8/2003 |
| JP | 2004-034186 | 2/2004 |
| WO | WO 97/04142 | 2/1997 |
| WO | WO 99/55930 | 11/1999 |
| WO | WO 00/52223 | 9/2000 |

* cited by examiner

Primary Examiner—Archene Turner
(74) Attorney, Agent, or Firm—Sughrue Mion, PLLC

(57) ABSTRACT

A method for forming a multi-layer, hard coating on a substrate, said hard coating comprising at least one metal element selected from the group consisting of transition metal elements of Groups 4a, 5a and 6a in the Periodic Table, Al, Si and B (at least one of said transition metal elements is indispensable), and at least one non-metal element selected from the group consisting of S, O, N and C (S is indispensable), and having a columnar structure comprising columnar crystal grains having pluralities of layers having different S contents, said method comprising placing said substrate in a chamber comprising evaporation sources having different plasma densities and a reaction gas for physical vapor deposition, and alternately bringing said substrate closer to each evaporation source, while keeping said reaction gas in a plasma state and said evaporation sources simultaneously in an active state.

24 Claims, 9 Drawing Sheets

HARD COATING AND ITS FORMATION METHOD, AND HARD-COATED TOOL

FIELD OF THE INVENTION

The present invention relates to a hard coating having excellent oxidation resistance, wear resistance, peel resistance, seizure resistance, impact resistance, breakage resistance, etc., which covers a substrate of cemented carbide, high-speed steel, die steel, etc., a method for forming such a hard coating, and a tool having such a hard coating.

BACKGROUND OF THE INVENTION

As high-speed metal cutting at a feed per one edge exceeding 0.3 mm becomes prevailing, conventional hard-coated tools have become insufficient in oxidation resistance, wear resistance, peel resistance, seizure resistance, impact resistance, breakage resistance, etc. of hard coatings. Accordingly, various technologies have been proposed to improve oxidation resistance, wear resistance, peel resistance, seizure resistance, impact resistance, breakage resistance, etc. of the hard coatings.

JP 2003-225807 A discloses a cutting tool having a hard coating layer exhibiting excellent wear resistance in high-speed cutting, the hard coating layer being formed by physically depositing a composite nitride of Ti and Y to an average thickness of 1-15 µm on a substrate of tungsten carbide-based cemented carbide or titanium carbonitride cermet, the hard coating layer having maximum-Y-component points (minimum-Ti-component points) and Y-component-free points (TiN points) alternately at a predetermined interval in a layer thickness direction, the concentration of the Y component changing smoothly between the maximum-Y-component point and the Y-component-free point, the maximum-Y-component points having a composition represented by the formula of $(Ti_{1-x}Y_x)N$, wherein x is 0.05-0.15 by atomic ratio, an interval between the adjacent maximum-Y-component point and the Y-component-free point being 0.01-0.1 µm. Japanese Patent 3,460,288 discloses a wear-resistant coated member comprising a substrate and a hard coating formed on its surface, the hard coating being formed by layers of nitrides, oxides, carbides, carbonitrides or borides of 2 or more elements selected from the group consisting of metal elements of Groups 4a, 5a and 6a, Al and Si, such that their compositions change continuously at a period of 0.4 nm to 50 nm to a total thickness of 0.5-10 µm. The hard coatings of JP 2003-225807 A and Japanese Patent 3,460,288 are multi-layer films with repeatedly changing concentrations or compositions. However, because any of the above technologies uses only an arc-discharge ion plating method, edge, they do not necessarily have satisfactory seizure resistance in the cutting of steel, etc., on which seizure tends to occur.

The seizure resistance of hard coatings depends on their lubrication. Hard-coated tools satisfactorily usable under severe cutting conditions cannot be obtained without improving the lubrication, impact resistance and breakage resistance of hard coatings with no damage to adhesion to substrates, hardness, oxidation resistance, wear resistance, thermal resistance, etc. In addition, taking environment into consideration, demand is mounting on tools for use in dry cutting without using cutting oils containing Cl, S, P, etc., for instance, even in the cutting of die-casting steel, called hard-to-cut materials.

As a cutting tool having a hard coating with improved lubrication, JP 5-239618 A discloses a machining tool with a coating having high wear resistance and lubrication, the coating comprising at least one element selected from the group consisting of oxygen, sulfur, selenium and tellurium, and at least one element selected from the group consisting of vanadium, niobium, tantalum, chromium, molybdenum and tungsten, and containing molybdenum disulfide for imparting lubrication. JP 11-509580 A discloses a method for forming a high-lubrication, hard coating comprising, for instance, molybdenum disulfide and TiN on a cutting tool, using a sputtering-ion plating system comprising a first target made of a metal sulfide (for instance, molybdenum disulfide), and a second target made of at least one metal selected from the group consisting of titanium, vanadium, chromium, zirconium, niobium, molybdenum, tantalum, hafnium and tungsten. However, these technologies do not provide hard coatings with sufficient adhesion and hardness, failing to sufficiently improve the wear resistance of cutting tools.

JP 8-127863 A discloses a wear-resistant, hard laminate coating comprising as main components at least one element selected from the group consisting of elements of Groups IVa, Va and VIa in the Periodic Table, Al, Si and B, and at least one element selected from the group consisting of B, C, N and O, the coating having at least 2 types of compound layers having different compositions and composition-changing layers, whose element compositions change in a thickness direction between the compound layers, the compound layers and the composition—changing layer being periodically laminated, and a crystal lattice being continuous over one period or more between the layers. Japanese Patent 3,416,938 discloses a multi-layer, hard coating for cutting tools, etc., in which compound layers (for instance, TiN) and layers with element compositions changing in a thickness direction (for instance, TiAlN) are alternately laminated, a crystal lattice being continuous with strain in said composition-changing layer.

JP 2001-293601 A discloses a cutting tool having a wear-resistant hard coating formed on a tool substrate, the coating comprising as a main component a nitride or carbonitride of at least one element selected from the group consisting of elements of Groups 4a, 5a and 6a in the Periodic Table and Al, said substrate being made of at least one selected from the group consisting of WC-based cemented carbide, cermet, silicon carbide, silicon nitride, aluminum nitride, alumina, boron carbide, sintered aluminum oxide-titanium carbide, high-speed steel, die steel and stainless steel, said wear-resistant, hard coating containing at least one type of fine, hard particles selected from the group consisting of $B_4C$, BN, $TiB_2$, TiB, TiC, WC, SiC, $SiN_x$ (x=0.5-1.33) and $Al_2O_3$.

However, any of the hard coatings described in the above references fails to meet the demand of having sufficient lubrication, peel resistance, impact resistance and breakage resistance capable of withstanding dry cutting conditions while maintaining oxidation resistance and wear resistance.

OBJECTS OF THE INVENTION

Accordingly, an object of the present invention is to provide a hard coating having excellent oxidation resistance, wear resistance and lubrication, as well as excellent adhesion to a substrate, impact resistance and breakage resistance.

Another object of the present invention is to provide a method for forming such a hard coating.

A further object of the present invention is to provide a hard-coated tool having excellent oxidation resistance, wear resistance, lubrication, impact resistance and breakage resistance, and improved adhesion to the substrate, with the seizure of a work and the diffusion of work elements into the hard coating suppressed in high-temperature cutting, thereby usable for dry cutting, high-speed cutting and high-feed cutting.

DISCLOSURE OF THE INVENTION

The first hard coating of the present invention formed on a substrate surface has a multi-layer structure, in which differences between average Si and/or Mo contents $Si_A$ and/or $MO_A$ in layers having larger Si and/or Mo contents (layers A) and average Si and/or Mo contents $Si_B$ and/or $MO_B$ in layers having smaller Si and/or Mo contents (layers B) are 0.2-5 atomic %. $Si_A$ and $Si_B$ are average Si contents in the layers A and B, respectively, and $MO_A$ and $MO_B$ are average Mo contents in the layers A and B, respectively.

The first hard coating preferably has a composition comprising metal components represented by $Al_wTi_xM_ySi_z$, wherein M is at least one transition metal element of Groups 4a, 5a and 6a in the Periodic Table, w, x, y and z meet the conditions of $20 \leq w \leq 50$, $25 \leq x \leq 75$, $2 \leq y \leq 20$, $0.01 \leq z \leq 10$, $w+x+y+z=100$, and $w \leq x+y+z$, by atomic %, and non-metal components represented by $O_aS_bN_{100-a-b}$, wherein a and b meet the conditions of $0.3 \leq a \leq 5$, and $0.1 \leq b \leq 5$, by atomic %, having a friction coefficient of 0.4 or less, and Si—O bonds near surface, a (200) plane of said hard coating being in a hetero-epitaxial relation with a (100) plane of said substrate.

The atomic ratio of the total amount of said non-metal elements (O+S+N) to the total amount of said metal elements (Al+Ti+M+Si) is preferably more than 1.0, more preferably 1.02-1.7. Said Si—O bonds are preferably in a range of 100-105 eV by ESCA.

It is preferable that a ratio (Ib/Ia) of a peak intensity Ib of a (200) plane to a peak intensity Ia of a (111) plane in its face-centered cubic structure measured by X-ray diffraction is 2.0 or more, and that the (200) plane has a lattice constant λ of 0.4155-0.4220 nm.

The second hard coating of the present invention comprises at least one metal element selected from the group consisting of transition metal elements of Groups 4a, 5a and 6a in the Periodic Table, Al, Si and B (at least one of said transition metal elements is indispensable), and at least one non-metal element selected from the group consisting of S, O, N and C (S is indispensable), a peak of S—O bonds on a surface being detected in a range of 167-170 eV by electron spectroscopy. The S content is preferably 0.1-10 atomic %.

The third hard coating of the present invention is formed on a substrate surface by physical vapor deposition, comprising at least one metal element selected from the group consisting of transition metal elements of Groups 4a, 5a and 6a in the Periodic Table, Al, Si and B (at least one of said transition metal elements is indispensable), and at least one non-metal element selected from the group consisting of S, O, N and C (S is indispensable), and having a columnar structure, in which crystal grains have a multi-layer structure having pluralities of layers having different S contents with interlayer boundary regions in which crystal lattice stripes are continuous, each layer having a thickness of 0.1-100 nm. This hard coating preferably has S—O bonds. The S content is preferably 0.1-10 atomic %.

A surface of the above hard coating is preferably made flat by machining.

The method of the present invention for forming a multi-layer, hard coating, which comprises at least one metal element selected from the group consisting of transition metal elements of Groups 4a, 5a and 6a in the Periodic Table, Al, Si and B (at least one of said transition metal elements is indispensable), and at least one non-metal element selected from the group consisting of S, O, N and C (S is indispensable), and has a columnar structure comprising columnar crystal grains having pluralities of layers having different S contents, on a substrate, comprises placing said substrate in a chamber comprising evaporation sources having different plasma densities and a reaction gas for physical vapor deposition, and alternately bringing said substrate closer to each evaporation source, while keeping said reaction gas in a plasma state and said evaporation sources simultaneously in an active state.

Said evaporation sources are preferably an arc-discharge ion plating (AIP) target and a magnetron sputtering (MS) target, and an AIP method and an MS method are continuously and alternately conducted while keeping both evaporation sources simultaneously in an active state. Columnar crystal grains having pluralities of layers having alternately and continuously changing S contents are formed by placing said substrate on a table, which is rotated to alternately bring said substrate closer to different targets.

The tool of the present invention has the above hard coating. The hard-coated tool of the present invention has, on a surface of said substrate, an intermediate layer comprising at least one selected from the group consisting of nitrides, carbonitrides and boronitrides of Ti, TiAl alloys, Cr and W.

When the hard coating of the present invention is applied to wear-resistant members and heat-resistant members required to have high hardness, such as cutting tools, etc., they are provided with extremely improved oxidation resistance and wear resistance, and high breakage resistance because of excellent adhesion to their substrates, and the seizure of works to the tools during dry cutting are suppressed. Accordingly, the hard-coated tool of the present invention can be used at high speed and feed during dry cutting. The high-feed cutting means cutting at feed exceeding 0.3 mm per one edge.

BEST MODE FOR CARRYING OUT THE INVENTION

[1] Composition of Hard Coating

Figure 1:
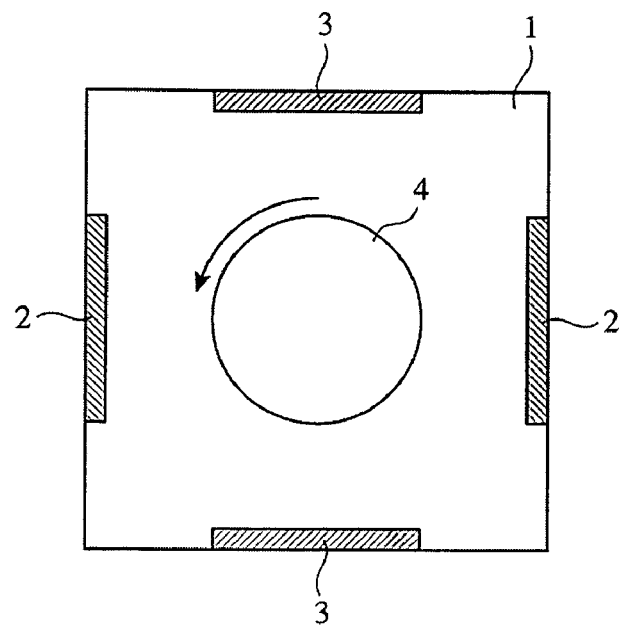
FIG. 1 is a schematic view showing a small vacuum chamber apparatus comprising evaporation sources having different plasma densities for physical vapor deposition to form the hard coating of the present invention.

The hard coating of the present invention has a composition comprising at least one metal element selected from the group consisting of transition metal elements of Groups 4a, 5a and 6a in the Periodic Table, Al, Si and B (at least one of said transition metal elements is indispensable), and at least one non-metal element selected from the group consisting of S, O, N and C (S is indispensable). O is preferably indispensable together with S as the non-metal elements.

S contained in the hard coating is oxidized at a relatively low temperature of about 200° C. on a surface, and the resultant oxide layer suppresses the seizure of a work as a protective layer. As a result, the hard coating containing S has an extremely lower friction coefficient than that of a hard coating containing no S at a cutting temperature. The oxide layer prevents the diffusion of work elements into the hard coating even under heat generation by cutting, suppressing the seizure of a work and giving improved wear resistance and breakage resistance to the hard coating, thereby enabling stable cutting.

The S content is preferably 0.1-10 atomic %. For instance, when S is added to a hard TiAlMoN coating of Conventional Example 3, its friction coefficient is reduced from 0.8 to 0.3-0.4 (Examples 1-15). This includes a synergistic effect with O. When S is added to a hard coating containing Ti, Al, Si and/or Mo, its lubrication is kept for a long period of time. However, when the S content is less than 0.1 atomic %, its lubrication is insufficient, resulting in a large friction coefficient during cutting under heat generation. On the other hand, when the S content exceeds 10 atomic %, the crystal structure of the hard coating changes from a columnar crystal structure to an amorphous-like fine structure, resulting in the hard coating with decreased hardness, and peel resistance reduced by increase in a residual compression stress, which affects largely adhesion. The S content is more preferably 0.1-7 atomic, most preferably 0.1-5 atomic %.

Because B increases the hardness and lubrication of a hard coating, a tool with a hard coating containing B has a long life. The improvement of hardness is obtained by a c-BN phase, and the improvement of lubrication is obtained by an h-BN phase. With an optimum ratio of B to N, improved hardness and the lubrication can be given to the hard coating. The ratio of the c-BN phase to the h-BN phase can be controlled by bias voltage applied during coating.

The hard coating according to a preferred embodiment of the present invention has a composition comprising metal components represented by $Al_wTi_xM_ySi_z$, wherein M is at least one transition metal element of Groups 4a, 5a and 6a in the Periodic Table, and w, x, y and z respectively meet the conditions of $20 \leq w \leq 50$, $25 \leq x \leq 75$, $2 \leq y \leq 20$, $0.01 \leq z \leq 10$, $w+x+y+z=100$, and $w \leq x+y+z$, by atomic %, and non-metal components represented by $O_aS_bN_{100-a-b}$, wherein a and b respectively meet the conditions of $0.3 \leq a \leq 5$, and $0.1 \leq b \leq 5$, by atomic %.

When the metal composition contains too much Al, $Al_2O_3$ is formed in a surface layer, resulting in the diffusion of Fe, etc. in a work into the hard coating in an actual cutting operation, though the hard coating has an improved static thermal resistance. Accordingly, w is preferably 50 or less, with $w \leq x+y+z$. On the other hand, when w is less than 20, the hard coating has insufficient wear resistance and oxidation resistance.

The addition of Mo and Si to a hard TiAlN coating is effective to prevent the seizure of a work. When Si is added to the hard coating in a proper amount, the migration of Al, which causes seizure, is suppressed, resulting in providing a chemically stable $Al_2O_3$ layer with improved peel resistance. The addition of Mo in a proper amount can make a Ti oxide finer, thereby suppressing seizure even under heat generation by cutting.

When Si is added to the hard coating covering a cutting tool, a dense Si oxide is formed by an Al oxide near surface by heat generated during cutting, thereby reducing the diffusion of Fe in a work into the hard coating, and thus suppressing seizure. The content z of Si is preferably 0.01-10 atomic %. When z exceeds 10 atomic %, the structure of the hard coating on a fractured surface changes from a columnar structure to a fine grain structure, though its hardness and thermal resistance are improved. A hard coating having a fine grain structure has many crystal grain boundaries, through which oxygen in the air and Fe in a work are easily diffused by heat generated during cutting. As a result, seizure occurs at cutting edges, resulting in deteriorated lubrication. Accordingly, the structure of the hard coating on a fractured surface is also an important factor, and it is particularly important in a high-feed cutting operation that the fractured surface has a columnar structure. Further, when z exceeds 10 atomic %, the hard coating has an increased residual stress, resulting in easy peeling occurring in an interface between the substrate and the hard coating. Because seizure occurs in peeled portions, it is important to prevent peeling. The lower limit of z, which is 0.01 atomic %, is a limit of easily detecting Si.

When Mo is added to a hard TiAlN coating, a dense crystalline Ti oxide is formed by the oxidation of the hard coating. An oxide layer having a dense crystal structure suppresses the diffusion of oxygen, which can path through an Si oxide and an Al oxide. The dense Ti oxide crystal suppresses the peeling of an $Al_2O_3$ surface layer. The content y of Mo is preferably 2-20 atomic %. The addition of Mo improves the thermal stability of the hard coating, suppressing seizure and hardening the hard coating. However, because Mo is a high-melting-point metal, when y exceeds 20 atomic %, the hardness of the hard coating rather decreases, and the structure of the physically deposited hard coating on a fractured surface changes from a columnar structure having excellent impact resistance to a fine grain structure, resulting in chipping and wear at an early cutting stage. Further, the discharge of the evaporation sources becomes unstable, making it difficult to stably form a uniform hard coating. On the other hand, when y is less than 2 atomic %, the hard coating does not have sufficiently high hardness. Added Mo substantially replaces Ti or Al.

With respect to the non-metal components represented by $O_aS_bN_{100-a-b}$, $0.3 \leq a \leq 5$ and $0.1 \leq b \leq 5$ are preferable for the improvement of lubrication. When the content a of O exceeds 5 atomic %, the hardness of the hard coating decreases despite improvement in lubrication, accompanied by a fine crystal structure on a fractured surface, so that wear easily occurs.

When the composition of the hard coating is represented by $(Al_wTi_xMo_ySi_z)_m(O_aS_bN_{100-a-b})_n$, an atomic ratio of the total amount of non-metal elements to the total amount of metal elements (n/m) is preferably more than 1.0, more preferably 1.02 or more. The upper limit of n/m is preferably 1.7.

[2] Structure and Properties of Hard Coating

A transmission electron microscopic observation reveals that the hard coating of the present invention has pluralities of layers having contrast in brightness. These layers comprises layers having larger Si and/or Mo contents (layers A), and layers having smaller Si and/or Mo contents (layers B), the layers A and B being laminated alternately without interfaces. Composition analysis by an electron probe microanalyzer (EPMA, EPM-1610 available from Shimadzu Corporation) indicates that difference between average Si and/or Mo contents $Si_A$ and/or $Mo_A$ in the layers A and average Si and/or Mo contents $Si_B$ and/or $Mo_B$ in the layers B is preferably within 0.2-5 atomic %. When $Si_A$-$Si_B$ and $Mo_A$-$Mo_B$ are respectively in a range of 0.2-5 atomic %, the hard coating has high impact resistance. With difference in the contents of Si and/or Mo in the layers A and B, it is possible to provide the hard coating with improved impact resistance and toughness and suppressed residual compression stress while keeping excellent lubrication.

The hard coating of the present invention also has a columnar structure, whose columnar crystal grains have pluralities of layers having different S contents without clear interfaces, with crystal lattice stripes continuous in interlayer boundary regions. The columnar structure is a crystal structure longitudinally grown in a thickness direction. Though the hard coating per se is polycrystalline, each crystal grain has a single-crystal-like structure. In addition, the columnar crystal grains have a multi-layer structure comprising pluralities of layers having different S contents in a growth direction, with crystal lattice stripes continuous in interlayer boundary regions. The continuity of the crystal lattice stripes need not exist in all interlayer boundary regions, but there need only be interlayer boundary regions in which crystal lattice stripes are substantially continuous, when observed by a transmission electron microscope. With columnar crystal grains having a multi-layer structure comprising pluralities of layers having different S contents, the hard coating has toughness as a whole. This is because relatively soft layers having larger S contents exhibit a cushioning effect between relatively hard layers. Further, the hard coating containing S has high lubrication. Accordingly, the multi-layer, hard coating having a columnar structure comprising pluralities of layers having different S contents has high toughness and thus excellent breakage resistance, as well as high lubrication. However, the S content difference is preferably 10 atomic % at most.

The hard coating of the present invention preferably has S—O bonds. Particularly the existence of S—O bonds on a surface provides the hard coating with excellent lubrication, thereby suppressing severe seizure, for instance, at an early cutting stage. The S—O bonds can be confirmed by a peak in a range of 167-174 eV in an X-ray photoelectron spectroscopy (XPS). XPS was conducted with an X-ray source of $AlK\alpha$ in an analysis region of 100 μm in diameter, using an electron neutralizer.

The friction coefficient of the hard coating is preferably 0.4 or less. When the friction coefficient exceeds 0.4, the lubrication of the hard coating is insufficient. The friction coefficient was measured at 600° C. in the air, using a ball-on-disc-type friction wear tester.

Each layer in the hard coating preferably has a thickness T of 0.1-100 nm. When T exceeds 100 nm, strain is generated in interlayer boundary regions, resulting in discontinuous lattice stripes in the crystal grains, thereby lowering the mechanical strength of the hard coating. For instance, when the hard coating is formed on a cutting tool, laminar breakage occurs in the hard coating by cutting impact at an early cutting stage. The prevention of strain in interlayer boundary regions is effective to improve the adhesion of the hard coating to the substrate. The lower limit of T is 0.1 nm, the minimum thickness for observing a layer structure by an X-ray diffraction apparatus or a transmission electron microscope. Also, when a multi-layer, hard coating is formed at a lamination period less than 0.1 nm, the resultant coating has uneven properties. To control the thickness T of each layer in the multi-layer, hard coating having columnar structure to 100 nm or less, and to make lattice stripes in each crystal grain continuous, the discharge output of an evaporation source in the MS method is preferably set at 6.5 kW or less.

A hard coating obtained by discharging a metal sulfide as an evaporation source for the MS method with a relatively lower plasma density is slightly softer than a hard coating obtained by the AIP method. Particularly layers having large S contents are softer. With softer layers having large S contents disposed between harder layers, the hard coating has high lubrication as well as high impact resistance and toughness.

In the MS method, a target of a metal sulfide such as WS, CrS, NbS, TiS, etc. can be used as an evaporation source. The use of these metal sulfide targets can produce relatively soft layers having large S contents, resulting in the hard coating with excellent lubrication, impact resistance and toughness.

In the AIP method with a relatively high plasma density, whose discharge energy is extremely high, it is difficult to add S to the hard coating. Because it is extremely difficult to discharge a target of WS, CrS, NbS, TiS, etc. in the AIP method, a usable target is made of (a) at least one transition metal element of Groups 4a, 5a and 6a in the Periodic Table, or (b) at least one transition metal element of Groups 4a, 5a and 6a in the Periodic Table, and at least one metal element selected from the group consisting of Al, Si and B.

The hard coating of the present invention preferably has an average thickness (total thickness) of 0.5-10 μm. To provide the hard coating with excellent lubrication and impact resistance, difference ($O_N$-$O_M$) between an oxygen content $O_N$ in a region of 1-30% of the average thickness from the surface and an oxygen content $O_M$ in a region of 1-30% of the average thickness from the interface with the substrate is preferably 0.3 atomic % or more. Because the addition of O increases a residual compression stress, the O content is preferably increased gradually from the start to end of coating. Because the hard coating has the largest O content near surface, a lot of metal oxides are formed to improve the lubrication of the hard coating. If a large amount of O is added from an early stage of coating, a substrate surface and an inner surface of the vacuum chamber apparatus are undesirably insulated.

It is confirmed by ESCA that the hard coating of the present invention has a binding energy of Si to oxygen in a range of 100-105 eV near surface. Due to the difference in a formation free energy between Al—O and Si—O, Si—O appears to be predominantly formed. The formation of dense Si—O increases the lubrication of the hard coating, thereby suppressing the seizure of a work even during high-efficiency cutting.

To conduct high-feed cutting, the hard coating should have high adhesion (intermolecular force) to the substrate. Thus, an oriented plane of a hard coating immediately on the substrate should be controlled such that the hard coating grows hetero-epitaxially from the substrate.

With the crystal orientation controlled, the hard coating in an interface with the substrate has reduced strain. In the case of a cemented carbide substrate, for instance, a hard coating should be controlled to be oriented in a (200) plane, to form a hard coating having a face-centered cubic structure on a (100) plane, the predominant orientation of WC. Namely, a ratio (Ib/Ia) of a peak intensity Ib of a (200) plane to a peak intensity Ia of a (111) plane in the X-ray diffraction of the hard coating is preferably 2 or more. When Ib/In addition is less than 2, crystals grow with large strain in an interface with the substrate, the hard coating not only is insufficiently adhered to the substrate, but also has large internal stress, so that it easily peels off from the substrate under severe conditions such as dry cutting.

Because a large residual stress reduces the adhesion of the hard coating to the substrate, the lattice constant $\lambda$ of the (200) plane affecting the residual stress is preferably controlled to 0.4155-0.4220. When the lattice constant $\lambda$ is more than 0.4220 nm, the residual compression stress of the hard coating exceeds 8 GPa, causing the peeling of the hard coating even if there is a hetero-epitaxial relation between the hard coating and the substrate. On the other hand, when the lattice constant $\lambda$ is less than 0.4155 nm, the hard coating has too low lubrication. The lattice constant $\lambda$ can be controlled in a range of 0.4155-0.4220 by adjusting the amount of Al or Si. With a lot of Al or Si, the lattice constant $\lambda$ decreases by the influence of an atom radius of an Al or Si element. On the contrary, the reduced content of Al or a coating condition with a large plasma density increases the lattice constant $\lambda$.

[3] Production Method of Hard Coating

To produce the multi-layer, hard coating of the present invention, physical vapor deposition with different plasma densities is utilized. Specifically, a high-plasma-density AIP method and a low-plasma-density MS method are simultaneously conducted in a reaction gas plasma to continuously grow crystal grains without interfaces, thereby providing crystal grains in the hard coating with large mechanical strength. On the contrary, when the AIP method and the MS method are conducted stepwise or intermittently, clear interfaces are generated between layers in the hard coating, providing the hard coating with smaller strength.

Because the AIP method generates an extremely high plasma density, ions generated in the plasma impinge on the substrate with large energy, high-quality hard coatings are formed with difficulty to suppress a residual compression stress. Also, it is difficult to provide pluralities of layers with composition differences (concentration differences) by the AIP method. Accordingly, the AIP method and the MS method are preferably combined to provide a high-hardness coating with excellent lubrication, adhesion and wear resistance.

Specifically as shown in FIG. 1, it is preferable to use a vacuum chamber apparatus comprising AIP targets 2 and MS targets 3, and a reaction gas suitable for both of the AIP method and the MS method the composition of each target per se is not restrictive. The AIP target 2 may be a single alloy target or pluralities of targets of metals or alloys having different compositions. When AIP method and the MS method are simultaneously conducted in the reaction gas in a plasma state while bringing the substrate alternately closer to the targets 2, 3, ions with different valences simultaneously reach the substrate. When the substrate is close to the evaporation source for the high-plasma-density AIP method, a hard layer is formed. And when it is close to the evaporation source for the low-plasma-density MS method, a soft layer is formed. There is a region between the hard layer and the soft layer, in which a composition changes not discontinuously but gradually (without clear interface). With the soft layer sandwiched by the hard layers via a gradually-changing-composition region, there is a cushioning effect to provide the entire hard coating with excellent toughness and impact resistance.

The hard coating obtained by this method has a columnar structure, in which each columnar crystal grain has a multi-layer structure comprising continuous lattice stripes without interfaces. On the contrary, when the AIP method and the MS method are intermittently conducted with the AIP targets 2 and the MS targets 3 alternately discharged, the resultant multi-layer structure has interfaces between the layers with weak bonding strength due to strain generated in the interfaces.

To add S to the hard coating, the evaporation source for the AIP method and the evaporation source for the MS method are simultaneously put in an active state, to form a hard coating based on transition metal elements with or without metal elements such as Al, etc. by the evaporation source for the AIP method, and to add S from the evaporation source for the MS method made of metal sulfides such as WS, CrS, NbS, etc. Because the MS method uses a lower plasma density, S is easily added to the hard coating. S evaporated from the MS target is ionized, to form crystal grains with other ions evaporated by the AIP method on the substrate surface. Pluralities of layers controlling crystal grains continuously grow without interfaces, so that S is trapped in the crystal grains to an atom level. To form S—O bonds in the hard coating, the reaction gas preferably contains O.

When metal sulfides are used for the MS target, S can be added to the hard coating, without causing an environmental or safety problem of a chemical vapor deposition method using a reaction gas such as $H_2S$, etc. Incidentally, when WS, CrS, NbS, etc. are used for the target for the high-plasma-density AIP method, a discharging phenomenon cannot easily be stabilized. Also, when metal sulfides are added to the AIP target, it is difficult to add S to the hard coating. Accordingly, it is preferable to add S in a relatively low plasma density state by the MS method. To include S—O bonds in the hard coating, the reaction gas preferably contains oxygen.

Even if sulfide targets such as $MoS_2$, etc. are used for the MS method, S is dissolved in crystal grains of TiAlMoSi compounds, etc., because the MS method is conducted simultaneously with a high-energy AIP method. Accordingly, the percentage of S existing as sulfides such as $MoS_2$, etc. in the hard coating is as small as 3% or less by area.

[4] Coated Tool

When a cutting tool is provided with the hard coating of the present invention, the seizure of a work can be prevented because of excellent lubrication, adhesion and wear resistance. Particularly because the hard coating of the present invention has excellent lubrication, the adhesion and diffusion of work elements can be suppressed in a dry cutting operation generating heat to high temperatures. The cutting tools having the hard coating of the present invention are usable in dry cutting, high-speed cutting, and high-feed cutting. The high-feed cutting is, for instance, cutting at a feed exceeding 0.3 mm/edge.

When the hard coating surface is made flat by machining, the wear resistance is stabilized, resulting in reduced unevenness of tool life.

With an intermediate layer made of a Ti nitride, carbonitride or boronitride, TiAl alloys, Cr, W, etc. formed on the substrate surface, adhesion increases between the substrate and the hard coating, thereby resulting in the hard coating with improved peel resistance and breakage resistance. The hard-coated cutting tool of the present invention is suitable for dry cutting, though it is usable for wet cutting, too. In any case, the existence of the intermediate layer can prevent the breakage of the hard coating, which occurs by repeated fatigue.

The materials of the cutting tool, on which the hard coating of the present invention is formed, is not restrictive, but may be cemented carbide, high-speed steel, die steel, etc. The hard coating of the present invention may be formed on wear-resistant members such as dies, bearings, rolls, piston rings, slidable members, etc., and heat-resistant members such as internal combustion engine parts, etc., which require high hardness, in addition to the cutting tools.

The present invention will be explained in more detail by Examples below, though it is not restricted thereto.

EXAMPLES 1-15, COMPARATIVE EXAMPLES 1-27, AND CONVENTIONAL Examples 1-4

Using a small vacuum chamber apparatus 1 comprising AIP targets 2 and MS targets 3 as an evaporation source shown in FIG. 1, a hard coating was formed on a substrate of each cemented carbide insert placed on a rotating table 4 in Examples 1-15. The AIP targets 2 were made of alloys having various compositions, and the MS targets 3 were made of metal sulfides. A reaction gas used was an $N_2$ gas, a $CH_4$ gas or an $Ar/O_2$ mixed gas depending on targeted hard coating compositions. To change the distribution of an S content in the hard coating in a lamination direction periodically and smoothly, plasma was generated at a reaction gas pressure of 3.0 Pa, simultaneously by both coating methods of AIP and MS. A substrate temperature was 400° C., and bias voltage was −40 V to −150 V. In Comparative Examples 1-27 and Conventional Examples 1-4, on the other hand, a hard coating was formed on each insert under the same conditions as in Examples except for using physical vapor deposition with the same plasma density (AIP or MS).

The measurement of a friction coefficient of each hard coating was carried out at as high a temperature as 600° C. in the air using a ball-on-disc-type friction wear tester.

The resultant hard-coated inserts were attached to the following tools to conduct cutting tests under the following conditions 1 and 2. In the cutting test under the condition 1, the life of each tool was expressed by cut length when cutting was made impossible by the breakage or wear of an insert edge, etc. In the cutting test under the condition 2, the life of the tool was determined when the maximum wear of a flank reached 0.3 mm in a case where there was no breakage, irregular wear or peeling. A work used in the cutting condition 1 had holes formed in advance at an equal interval on a surface by drilling. This work surface was intermittently cut under a high-performance cutting condition to evaluate the insert life.

Cutting Condition 1

| | |
|---|---|
| Tool: | Face mill, |
| Insert shape: | SDE53 with special shape, |
| Cutting method: | Center cutting, |
| Work shape: | 100 mm in width and 250 mm in length, |
| Work: | S50C (HRC30) having many drilled holes of 6 mm in diameter, |
| Depth of cutting: | 2.0 mm, |
| Cutting speed: | 120 m/minute, |
| Feed per one edge: | 1.0 mm/edge, and |
| Cutting oil: | not used. |

Cutting Condition 2

| | |
|---|---|
| Tool: | Face mill, |
| Insert shape: | SDE53 with special shape, |
| Cutting method: | Center cutting, |
| Work shape: | 100 mm in width and 250 mm in length, |
| Work: | S50C (HRC30), |
| Depth of cutting: | 2.0 mm, |
| Cutting speed: | 120 m/minute, |
| Feed per one edge: | 1.0 mm/edge, and |
| Cutting oil: | not used. |

Table 1 shows the compositions and production conditions of the hard coatings of Examples, Comparative Examples and Conventional Examples, and Table 2 shows the structures and properties of the hard coatings, and the tool lives. The compositions of the hard coatings were represented by $(Al_w Ti_x Mo_y Si_z)_m (O_a S_b N_{100-a-b})_n$. In Table 1, Al+Ti+Mo+Si=100.0, and N =100.0−(O+S) n/m was an atomic ratio of the total amount of non-metal elements to the total amount of metal elements. Accordingly, in Example 1, for instance, because n/m was 1.10, the O content was 1.1×[n/(m+n)]=0.58 atomic %, and the S content was 1.0×[n/(m+n)]=0.52 atomic %, per 100 atomic % of the entire hard coating.

TABLE 1

| No. | Composition (atomic %) | | | | | | n/m | Production Conditions | |
|---|---|---|---|---|---|---|---|---|---|
| | Al | Ti | Mo | Si | O[1] | S[1] | | Evaporation Source | What Was Controlled |
| Example 1 | 20.0 | 73.6 | 5.4 | 1.0 | 1.1 | 1.0 | 1.10 | AIP + MS | Plasma density |
| Example 2 | 46.4 | 25.0 | 19.2 | 9.4 | 0.5 | 0.5 | 1.02 | AIP + MS | Plasma density |
| Example 3 | 36.4 | 53.2 | 10.0 | 0.4 | 2.5 | 3.5 | 1.15 | AIP + MS | Plasma density |
| Example 4 | 26.4 | 62.5 | 5.5 | 5.6 | 3.8 | 2.8 | 1.20 | AIP + MS | Plasma density |
| Example 5 | 33.4 | 51.1 | 6.6 | 8.9 | 4.8 | 1.0 | 1.15 | AIP + MS | Plasma density |
| Example 6 | 40.5 | 39.2 | 15.3 | 5.0 | 0.4 | 0.2 | 1.20 | AIP + MS | Plasma density |
| Example 7 | 40.0 | 38.3 | 16.2 | 5.5 | 1.6 | 4.6 | 1.35 | AIP + MS | Plasma density |
| Example 8 | 22.0 | 71.4 | 5.0 | 1.6 | 0.0 | 1.0 | 1.70 | AIP + MS | Plasma density |
| Example 9 | 33.6 | 51.5 | 10.5 | 4.4 | 3.3 | 4.5 | 1.10 | AIP + MS | Plasma density |
| Example 10 | 39.4 | 42.8 | 17.4 | 0.4 | 3.1 | 1.9 | 1.15 | AIP + MS | Plasma density |
| Example 11 | 40.0 | 47.6 | 2.6 | 9.8 | 1.9 | 1.8 | 1.15 | AIP + MS | Plasma density |
| Example 12 | 36.2 | 48.1 | 12.2 | 3.5 | 4.6 | 2.7 | 1.10 | AIP + MS | Plasma density |
| Example 13 | 24.0 | 62.7 | 4.4 | 8.9 | 4.5 | 3.0 | 1.15 | AIP + MS | Plasma density |
| Example 14 | 48.4 | 25.5 | 17.2 | 8.9 | 2.1 | 2.4 | 1.45 | AIP + MS | Plasma density |
| Example 15 | 48.0 | 39.5 | 3.1 | 9.4 | 4.9 | 4.7 | 1.15 | AIP + MS | Plasma density |
| Com. Ex. 1 | 20.0 | 77.5 | 2.0 | 0.5 | 1.3 | 4.9 | 1.15 | MS | Sputtering current |
| Com. Ex. 2 | 48.0 | 23.4 | 19.2 | 9.4 | 0.7 | 4.4 | 1.20 | AIP | Target composition |
| Com. Ex. 3 | 36.4 | 53.2 | 10.0 | 0.4 | 2.7 | 6.6 | 1.15 | AIP | Arc current |
| Com. Ex. 4 | 20.0 | 76.0 | 3.0 | 1.0 | 4.0 | 5.6 | 1.20 | MS | Target composition |
| Com. Ex. 5 | 33.4 | 51.1 | 6.6 | 8.9 | 5.0 | 5.1 | 1.10 | AIP | Target composition |
| Com. Ex. 6 | 40.5 | 39.2 | 15.3 | 5.0 | 0.6 | 6.0 | 1.15 | AIP | Target composition |
| Com. Ex. 7 | 40.0 | 38.3 | 16.2 | 5.5 | 1.8 | 6.2 | 1.15 | AIP | Arc current |
| Com. Ex. 8 | 22.0 | 71.4 | 5.0 | 1.6 | 2.4 | 4.3 | 1.10 | AIP | Target composition |
| Com. Ex. 9 | 33.6 | 51.5 | 10.5 | 4.4 | 3.5 | 5.7 | 1.15 | AIP | Arc current |
| Com. Ex. 10 | 39.4 | 42.8 | 17.4 | 0.4 | 3.3 | 4.4 | 1.15 | AIP | Target composition |
| Com. Ex. 11 | 48.0 | 23.4 | 19.2 | 9.4 | 2.1 | 5.5 | 1.20 | AIP + MS | Target composition |
| Com. Ex. 12 | 33.4 | 51.1 | 6.6 | 8.9 | 4.8 | 5.8 | 1.15 | AIP + MS | Plasma density |
| Com. Ex. 13 | 20.0 | 77.5 | 2.0 | 0.5 | — | — | 1.15 | AIP | Target composition |
| Com. Ex. 14 | 52.0 | 31.2 | 10.0 | 6.8 | 0.8 | 5.3 | 1.20 | AIP | Target composition |
| Com. Ex. 15 | 18.0 | 52.0 | 18.0 | 12.0 | 5.4 | 7.4 | 1.15 | AIP | Target composition |
| Com. Ex. 16 | 50.0 | 36.2 | 13.5 | 0.3 | 5.9 | 7.2 | 1.20 | AIP | Target composition |
| Com. Ex. 17 | 36.0 | 61.2 | 2.4 | 0.4 | 1.5 | 5.6 | 1.10 | AIP | Target composition |
| Com. Ex. 18 | 55.0 | 20.4 | 15.0 | 9.6 | 2.4 | 6.2 | 1.15 | AIP | Target composition |
| Com. Ex. 19 | 39.0 | 32.5 | 20.5 | 8.0 | 3.3 | 6.1 | 1.15 | AIP | Target composition |
| Com. Ex. 20 | 22.0 | 71.4 | 5.0 | 1.6 | 2.6 | 5.7 | 1.10 | AIP | Target composition |
| Com. Ex. 21 | 27.0 | 43.8 | 18.0 | 11.2 | 3.7 | 6.0 | 1.15 | AIP | Target composition |
| Com. Ex. 22 | 26.0 | 47.8 | 22.0 | 4.2 | 4.7 | 5.4 | 1.15 | AIP | Target composition |
| Com. Ex. 23 | 40.0 | 47.6 | 2.6 | 9.8 | 2.7 | 5.6 | 1.15 | AIP | Target composition |
| Com. Ex. 24 | 36.2 | 48.1 | 12.2 | 3.5 | 4.0 | 5.4 | 1.20 | AIP | Target composition |
| Com. Ex. 25 | 24.0 | 62.7 | 4.4 | 8.9 | 5.0 | 5.1 | 1.15 | AIP | Target composition |
| Com. Ex. 26 | 49.4 | 24.5 | 17.2 | 8.9 | 0.6 | 5.7 | 1.20 | AIP | Target composition |
| Com. Ex. 27 | 48.0 | 39.5 | 3.1 | 9.4 | 1.8 | 5.5 | 1.10 | AIP | Target composition |
| Conv. Ex. 1 | (TiAl)N | | | | | | | AIP | Target composition |
| Conv. Ex. 2 | (TiAlSi)(CN)[2] | | | | | | | AIP | Target composition |
| Conv. Ex. 3 | (TiAlMo)N | | | | | | | AIP | Target composition |
| Conv. Ex. 4 | (TiAl)(ON)[3] | | | | | | | AIP | Target composition |

Note:
[1] Maximum values measured by EPMA (electron probe microanalyzer, EPM-1610 available from Shimadzu Corporation).
[1] Maximum value measured by EPMA.
[2] The Si content measured by EPMA was 3.3 atomic %.
[3] The O content measured by EPMA was 3.3 atomic %.

TABLE 2

| No. | $Si_A - Si_B$[1] | $O_N - O_M$[2] | Si—O[3] | Ib/Ia[4] | HE[5] | μ[6] | λ[7] (nm) | Life[8] (m) Condition 1 | Life[8] (m) Condition 2 |
|---|---|---|---|---|---|---|---|---|---|
| Example 1 | 0.3 | 0.9 | Yes | 2.40 | Yes | 0.33 | 0.4198 | 55 | 69.5 |
| Example 2 | 4.9 | 0.4 | Yes | 3.60 | Yes | 0.36 | 0.4189 | 50 | 70.6 |
| Example 3 | 0.2 | 2.2 | Yes | 4.80 | Yes | 0.29 | 0.4178 | 52 | 79.6 |
| Example 4 | 1.5 | 3.5 | Yes | 7.90 | Yes | 0.30 | 0.4170 | 54 | 67.8 |
| Example 5 | 4.2 | 4.4 | Yes | 8.90 | Yes | 0.26 | 0.4160 | 64 | 68.4 |
| Example 6 | 2.4 | 0.1 | Yes | 2.90 | Yes | 0.40 | 0.4194 | 58 | 72.4 |
| Example 7 | 2.3 | 1.2 | Yes | 3.00 | Yes | 0.35 | 0.4192 | 57 | 80.0 |
| Example 8 | 0.8 | 1.8 | Yes | 4.30 | Yes | 0.30 | 0.4182 | 46 | 75.0 |
| Example 9 | 1.6 | 2.9 | Yes | 7.60 | Yes | 0.25 | 0.4176 | 55 | 78.0 |
| Example 10 | 0.3 | 3.2 | Yes | 7.40 | Yes | 0.27 | 0.4174 | 60 | 73.0 |
| Example 11 | 4.0 | 1.6 | Yes | 3.20 | Yes | 0.36 | 0.4190 | 60 | 71.2 |

TABLE 2-continued

| No. | $Si_A - Si_B$[1] | $O_N - O_M$[2] | Si—O[3] | Ib/Ia[4] | HE[5] | μ[6] | λ[7] (nm) | Life[8] (m) Cond. 1 | Cond. 2 |
|---|---|---|---|---|---|---|---|---|---|
| Example 12 | 2.2 | 4.3 | Yes | 8.50 | Yes | 0.24 | 0.4164 | 54 | 84.2 |
| Example 13 | 1.7 | 4.2 | Yes | 8.20 | Yes | 0.27 | 0.4166 | 60 | 69.0 |
| Example 14 | 3.4 | 1.8 | Yes | 4.00 | Yes | 0.32 | 0.4186 | 53 | 73.0 |
| Example 15 | 4.7 | 4.7 | Yes | 9.30 | Yes | 0.30 | 0.4156 | 60 | 70.4 |
| Com. Ex. 1 | —[9] | 0.7 | Yes | 0.05 | Yes | 0.54 | 0.4256 | 0.5 | 10.0 |
| Com. Ex. 2 | 4.9 | 0.3 | Yes | 0.12 | Yes | 0.55 | 0.4255 | 18 | 5.0[10] |
| Com. Ex. 3 | 0.2 | 2.2 | Yes | 0.88 | Yes | 0.58 | 0.4226 | 14 | 16.0 |
| Com. Ex. 4 | 0.4 | 3.5 | Yes | 0.96 | Yes | 0.44 | 0.4230 | 4 | 11.0[11] |
| Com. Ex. 5 | 4.2 | 4.5 | Yes | 1.66 | Yes | 0.48 | 0.4210 | 14 | 9.2[11] |
| Com. Ex. 6 | 2.4 | 0.3 | Yes | 0.66 | Yes | 0.53 | 0.4242 | 15 | —[12] |
| Com. Ex. 7 | 2.3 | 1.3 | Yes | 0.72 | Yes | 0.59 | 0.4236 | 15 | —[12] |
| Com. Ex. 8 | —[9] | 1.9 | Yes | 0.44 | Yes | 0.57 | 0.4252 | 15 | 2.0 |
| Com. Ex. 9 | 1.6 | 3.0 | Yes | 0.56 | Yes | 0.54 | 0.4248 | 17 | 8.5[13] |
| Com. Ex. 10 | —[9] | 2.8 | Yes | 0.79 | Yes | 0.55 | 0.4228 | 19 | 13.0[14] |
| Com. Ex. 11 | 5.3 | 0.3 | Yes | 9.30 | Yes | 0.58 | 0.4156 | 24 | 28.0 |
| Com. Ex. 12 | 7.2 | 4.5 | Yes | 8.00 | Yes | 0.44 | 0.4166 | 28 | 35.0 |
| Com. Ex. 13 | 0.2 | — | No | 0.44 | Yes | 0.59 | 0.4252 | 15 | 29.0 |
| Com. Ex. 14 | 4.2 | 0.2 | Yes | 0.12 | No | 0.57 | 0.4255 | 16 | 5.0[15] |
| Com. Ex. 15 | 9.4 | 5.2 | Yes | 0.44 | Yes | 0.54 | 0.4252 | 15 | 26.0 |
| Com. Ex. 16 | 0.1 | 5.7 | Yes | 0.12 | No | 0.55 | 0.4255 | 16 | 11.0[11] |
| Com. Ex. 17 | 0.2 | 0.2 | No | 0.88 | Yes | 0.58 | 0.4226 | 20 | 15.0[16] |
| Com. Ex. 18 | 7.0 | 2.2 | Yes | 0.12 | No | 0.44 | 0.4255 | 16 | 9.2[11] |
| Com. Ex. 19 | 5.4 | 3.1 | Yes | 0.79 | Yes | 0.48 | 0.4228 | 19 | —[12] |
| Com. Ex. 20 | 0.8 | 0.2 | Yes | 0.44 | Yes | 0.53 | 0.4252 | 15 | 38.0 |
| Com. Ex. 21 | 8.6 | 3.5 | Yes | 0.56 | Yes | 0.51 | 0.4248 | 17 | —[12] |
| Com. Ex. 22 | 1.6 | 4.5 | Yes | 0.44 | Yes | 0.55 | 0.4252 | 15 | 32.0 |
| Com. Ex. 23 | 7.2 | 1.6 | Yes | 1.55 | Yes | 0.55 | 0.4233 | 18 | 14.2[14] |
| Com. Ex. 24 | 0.9 | 4.3 | Yes | 1.23 | Yes | 0.58 | 0.4238 | 20 | 13.5[14] |
| Com. Ex. 25 | 6.3 | 4.2 | Yes | 0.03 | Yes | 0.44 | 0.4260 | 15 | 4.5[15] |
| Com. Ex. 26 | 6.3 | 1.8 | Yes | 0.68 | Yes | 0.48 | 0.4240 | 16 | 1.2[17] |
| Com. Ex. 27 | 6.8 | 4.6 | Yes | 1.89 | Yes | 0.53 | 0.4244 | 16 | 2.4[17] |
| Conv. Ex. 1 | —[19] | —[9] | —[9] | —[9] | —[9] | 0.86 | —[9] | 22 | 24.3 |
| Conv. Ex. 2 | —[19] | —[9] | —[9] | —[9] | —[9] | 0.90 | —[9] | 20 | 34.5[18] |
| Conv. Ex. 3 | —[19] | —[9] | —[9] | —[9] | —[9] | 0.80 | —[9] | 18 | 34.5[18] |
| Conv. Ex. 4 | —[19] | —[9] | —[9] | —[9] | —[9] | 0.70 | —[9] | 22 | 27.3 |

Note:
[1]Difference (atomic %) between an Si content $Si_A$ in larger-Si-content layers A and an Si content $Si_B$ in smaller-Si-content layers B, which were measured by EPMA.
[2]Difference between an oxygen content $O_N$ in a region of 1-30% of an average thickness from the surface and an oxygen content $O_M$ in a region of 1-30% of an average thickness from the interface with the substrate (measured by EPMA).
[3]The presence or absence of Si—O bonds in a surface layer.
[4]A ratio of a peak intensity Ib of a (200) plane in a face-centered cubic lattice to a peak intensity Ia of a (111) plane, which were measured by X-ray diffraction.
[5]The presence or absence of a hetero-epitaxial relation in an interface between the hard coating and the substrate.
[6]Friction coefficient.
[7]Lattice constant of the (200) plane.
[8]Expressed by cut length until the tool became unable to cut by the breakage or wear of an edge, etc.
[9]Could not be detected.
[10]Cutting was stopped because of peeling.
[11]Crater wear occurred early.
[12]Cutting was stopped because of large early peeling.
[13]Immediately after peeling occurred, the hard coating was broken.
[14]Cutting was stopped because of large early crater wear.
[15]Cutting was stopped because of peeling.
[16]Immediately after seizure occurred, the hard coating was broken.
[17]Broken.
[18]Small peeling occurred early.
[19]Repetition of continuous composition change.

The coated inserts of Examples 1-15 showed excellent cutting performance than those of Comparative Examples and Conventional Examples. This appears to be due to the fact that, the formation of high-hardness layers and low-hardness layers continuously and alternately with Si contents continuously changed between these layers using both AIP and MS methods with different plasma densities provides a hard coating with excellent film strength (breakage resistance) while maintaining wear resistance and lubrication. Though methods of intermittently or continuously changing target compositions or coating conditions may alternately form layers with different Si contents, hard coatings formed by such methods have insufficient strength.

In Comparative Examples 1, 8 and 10, hard coatings were formed using a single evaporation source, such that there were no composition differences. Because the MS method has a lower plasma density than the AIP method, the hard coating of Comparative Example 1 formed by the MS method did not have high hardness, resulting in insufficient wear resistance and thus breakage in an early cutting stage. The hard coatings of Comparative Examples 8 and 10 formed by the AIP method were poor in toughness and intermittent cutting performance despite high hardness.

In Comparative Examples 2, 3 and 5-7, composition differences were given to hard coatings by the AIP method, though failing to obtain targeted cutting performance. Particularly in Comparative Examples 3, 6 and 7, the S contents were outside the range of the present invention. Hard coatings formed only by the AIP method were poor in toughness despite high hardness, because of a high plasma density during discharging regardless of target compositions. The hard coatings of Comparative Examples with composition differences are poor in breakage resistance and adhesion to the substrate because of an increased residual stress. Though some of the hard coatings of Comparative Examples had hardness Hv exceeding 3500, they suffered breakage in intermittent cutting because of small toughness, resulting in tools with short lives.

The hard coatings of Comparative Examples 11 and 12 had improved breakage resistance because of composition differences generated by using both AIP and MS methods. However, the hard coatings did not have a columnar structure extending continuously over pluralities of layers because of composition differences exceeding the targeted range, resulting in the lamination of layers with intermittent composition differences. Thus, the hard coatings were broken because of weak interlayer bonding, failing to obtain a targeted cutting performance.

In the cutting test under the condition 2, as shown in Table 2, the hard coatings of Examples 1-15 had friction coefficients of 0.4 or less to steel, showing an excellent cutting performance. Particularly the hard-coated inserts of Examples 3, 7 and 12 showed sufficiently improved cutting lives than those of Conventional Examples 1-3. The hard coatings of Examples 3 and 12 had small friction coefficients, thereby exhibiting excellent lubrication and decreased seizure to works at an early cutting stage. Accordingly, the hard coatings of Examples 3 and 12 did not wear in a cutting distance in Comparative Examples 13-22. The coated insert of Example 12 had life 2.4 times those of Conventional Examples 2 and 3 having the longest life.

The cutting lives of Examples are affected by the O contents, the existence of an Si oxide in surface layers, and the existence of hetero-epitaxial growth. The balance of the Mo and Si contents is also important. Hard coatings with excellent cutting performance and long tool lives generally tend to have larger Mo contents than Si contents. Though the hard coatings of Examples have higher cutting performance than those of Conventional Examples and Comparative Examples even if the Si contents are larger than the Mo contents, higher cutting performance is obtained when Mo>Si.

The lubrication of the hard coatings was drastically improved by the addition of O. For instance, the hard coating of Comparative Example 13 containing no O had substantially the same cutting performance as those of most hard coatings of Conventional Examples. When the O content exceeds 5 atomic %, early wear occurs despite appreciable lubrication in dynamic cutting as in Comparative Examples 15 and 16, even if the metal compositions are within the range of the present invention. This appears to be due to the fact that a large O content changes the structure of the hard coating on a fractured surface from a columnar structure to a fine structure, resulting in low hardness. Though there was no early breakage until a wear life in Comparative Example 15 because of good adhesion to the substrate, the hard coating of Comparative Example 16 peeled off from a flank of the insert because of low adhesion to the substrate. Even within the composition range of the present invention, peeling occurred in the case of insufficient adhesion to the substrate, failing to conduct stable cutting.

The hard coating of Comparative Example 18 whose Al content was outside the range of the present invention had insufficient adhesion to the substrate. In the hard coating of Comparative Example 22, the Mo content was outside the range of the present invention. When the metal composition of the hard coating is outside the range of the present invention, its fractured surface has a fine structure, resulting in rapid wear on the insert flank during cutting, and thus a short life.

Figure 2:
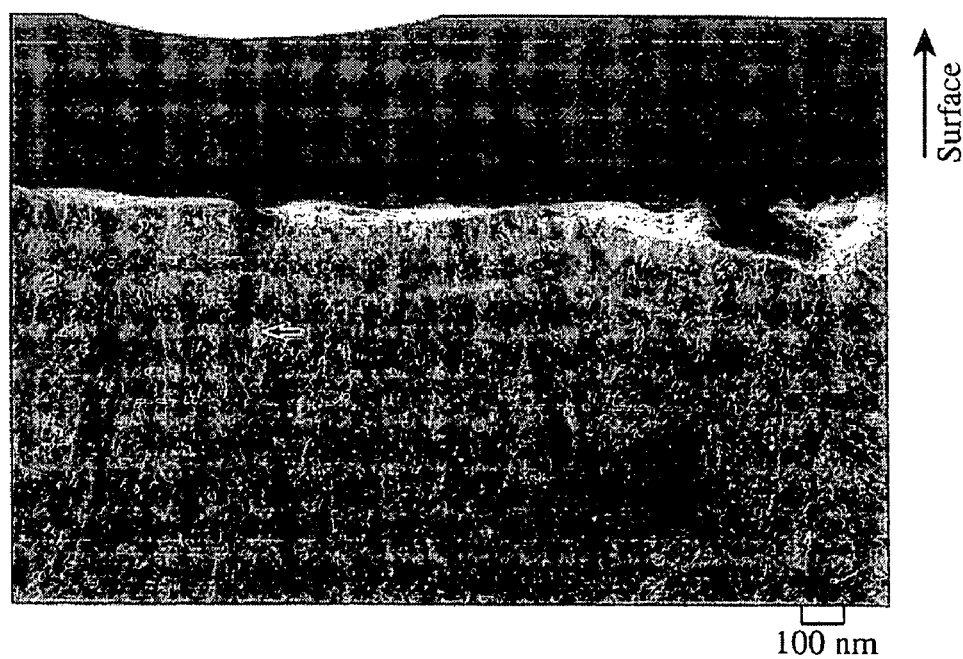
FIG. 2 is a transmission electron photomicrograph (magnification: 50,000) showing a fractured surface of the hard coating of Example 1.

FIG. 2 shows a fractured surface of the hard coating of Example 1. The hard coating of Example 1 had a multi-layer structure, in which layers formed by the AIP method and layers formed by the MS method were alternately and continuously laminated without interfaces. It was confirmed that there were clear differences in the concentrations of Mo, Si and S in the hard coatings from surface to inside.

Figure 3:
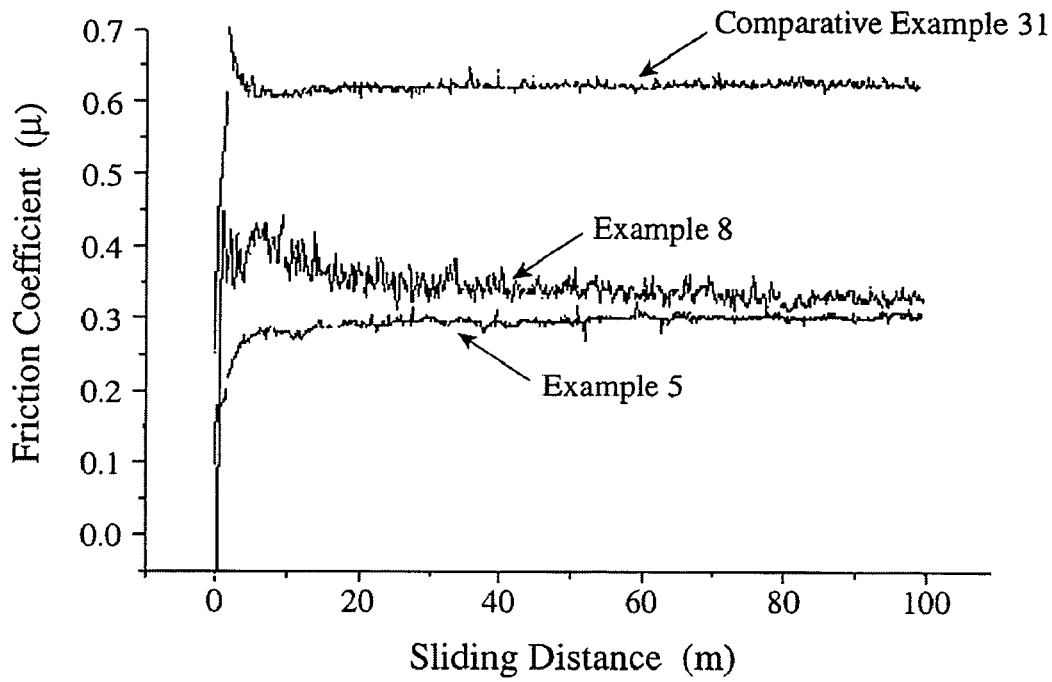
FIG. 3 is a graph showing the friction coefficients of the hard coatings of Examples 5 and 8 and Comparative Example 31.

FIG. 3 shows the friction coefficients of hard coatings containing S and O. Example 8 contained 1 atomic % of S, and Example 5 contained 1 atomic % of S and 4.8 atomic % of O. Examples 5 and 8 had smaller friction coefficients than that of Comparative Example 13 containing no S and O. When the O content is 0.3 atomic % or more, the hard coating has high lubrication, suppressing the seizure of a work to the hard coating during high-performance cutting. Oxygen remaining in the vacuum chamber apparatus is mixed in an amount of about 0.1 atomic % into a hard coating by physical vapor deposition, but O on this level is insufficient to reduce the friction coefficient.

It has been made clear that the method of adding O affects the cutting performance. Though O was added without changing its amount from the start to end of coating in Comparative Examples 14, 17 and 20, O was added with content inclination from an interface with the substrate to a surface from the start to end of coating in Examples and Comparative Examples 15, 16, 18, 19, 21 and 22. Cutting tests indicated that the hard coatings with inclined O contents had better properties.

Figure 4:
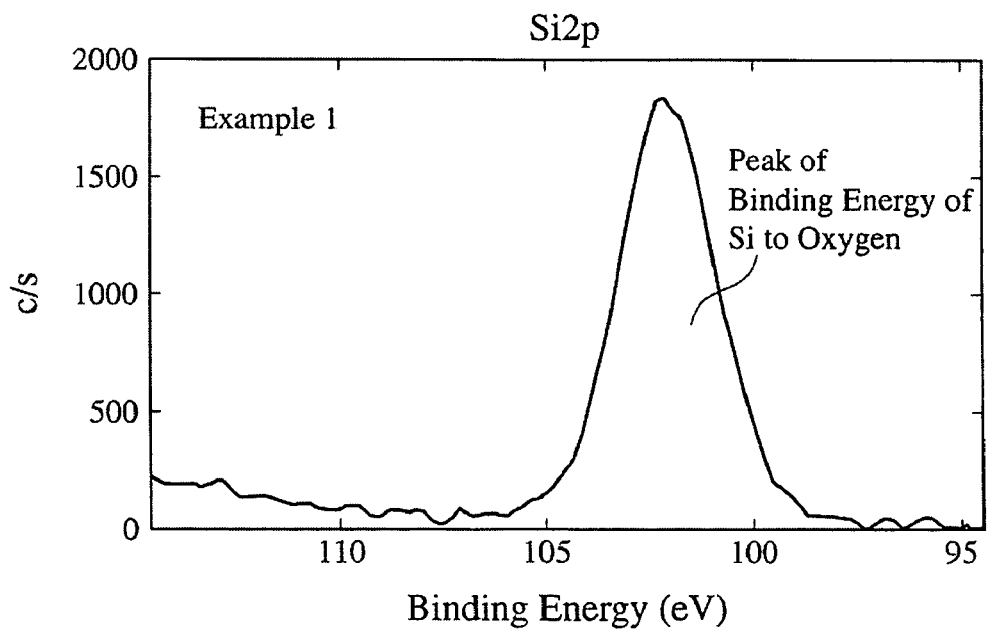
FIG. 4 is an ESCA chart of the hard coating of Example 1.

FIG. 4 shows the chemical bonding state of the hard coating of Example 1 near surface, which was measured by ESCA. It is clear from FIG. 4 that the hard coating of the present invention had a binding energy of Si to oxygen in a range of 100 eV to 105 eV.

Figure 5:
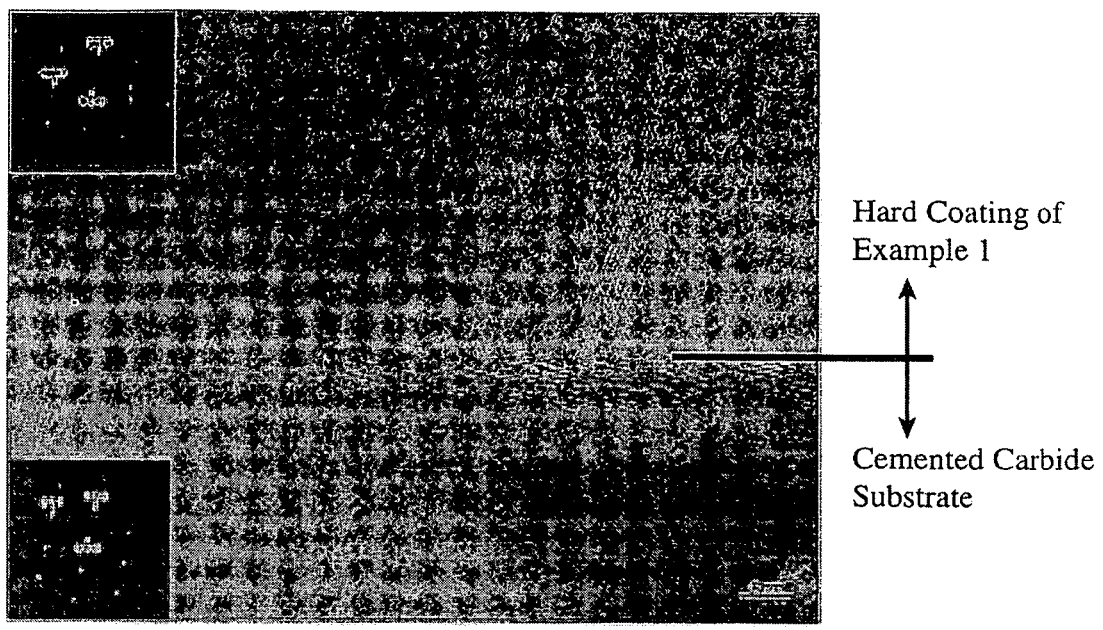
FIG. 5 is an electron diffraction photomicrograph showing a hetero-epitaxial relation in an interface of the substrate and the hard coating in the hard coating of Example 1.

As shown in FIG. 5, a (100) plane of WC in the substrate is matched with a (200) plane of said hard coating of (TiAlMoSi)(OSN), resulting in a strong intermolecular force and thus high adhesion of the hard coating to the substrate.

Because Comparative Examples 19, 21 and 22 had Mo and Si contents outside the ranges of the present invention, they had large residual compression stress, resulting in peeling at an early cutting stage. It was confirmed from the above test results that the lubrication of hard coatings can be drastically improved by having metal compositions in predetermined ranges, containing O and S, and forming dense Si oxides on surface, resulting in improved tool lives.

Table 2 shows a ratio of a peak intensity Ib of a (200) plane in a face-centered cubic lattice to a peak intensity Ia of a (111) plane in X-ray diffraction, the lattice constant $\lambda$ of the (200) plane, and cutting test results. Because the Ib/Ia and the lattice constant $\lambda$ were outside the ranges of the present invention despite the addition of S and O in Comparative Examples 1-10 and 23-27, crater wear and peeling occurred easily. The hard coatings of Comparative Examples 2, 6-9 and 23-27 having lattice constants $\lambda$ of the (200) plane exceeding 0.4230 nm had extremely short cutting lives regardless of the metal compositions and the S and O contents. The lattice constant λ affects the internal stress of the hard coating. With large X, breakage or peeling occurs easily in the hard coating because of a large residual compression stress in an interface between the substrate and the hard coating, even if the hard coating grows hetero-epitaxially from the substrate, resulting in a short tool life. Accordingly, to provide a hard coating with a stable cutting performance, it is important to properly control crystal orientation as well as the metal composition, the S and O content, and the O-adding method.

EXAMPLES 16-29, COMPARATIVE EXAMPLES 28-41, AND CONVENTIONAL EXAMPLES 5-11

Using a small vacuum chamber apparatus 1 shown in FIG. 1 comprising AIP targets 2 and MS targets 3 as evaporation sources, a hard coating was formed on each insert substrate of cemented carbide placed on a rotating table 4. The AIP targets 2 were made of alloys of various compositions, and the MS targets 3 were made of metal sulfides. A reaction gas was an $N_2$ gas, a $CH_4$ gas or an $Ar/O_2$ mixed gas depending on targeted hard coating compositions. To change an S content distribution in the hard coating periodically and smoothly in a lamination direction, the pressure of the reaction gas was set at 3.0 Pa to generate plasma for both film-forming methods of AIP and MS. The substrate temperature was set at 400° C., and bias voltage of −40 V to −150 V was applied.

The resultant hard-coated inserts were subjected to cutting tests under the following condition 3. Works were made of SKD61 steel (hardness HRC: 45) for die-casting molds. SKD61 is easily adhered to an insert edge at an early cutting stage, thereby severely damaging a hard coating at the edge. A work surface was cut under high-performance cutting conditions to evaluate cuttable length until the hard coating was broken by seizure, wear or heat cracking. Table 3 shows the compositions of targets used for producing the hard coatings, and S—O bonds and S contents in the hard coatings, and Table 4 shows the structures of the hard coatings and cutting test results.

Cutting Condition 3

| Tool: | Face mill, |
|---|---|
| Insert shape: | SDE53 with special shape, |
| Cutting method: | Center cutting, |
| Work shape: | Width 100 mm × length 250 mm, |
| Work: | SKD61 with hardness: HRC45, |
| Depth of cutting: | 1.5 mm, |
| Cutting speed: | 100 m/minute, |
| Feed per one edge: | 0.6 mm/edge, and |
| Cutting oil: | Not used. |

TABLE 3

| | Target | | | Evaluation of Hard Coating | |
|---|---|---|---|---|---|
| No. | AIP (atomic %) | MS | Coating Method | S—O[1] | S Content[2] (atomic %) |
| Example 16 | (50Ti—50Al) | WS$_2$ | AIP + MS | Yes | 0.2 |
| Example 17 | (45Ti—55Al) | NbS | AIP + MS | Yes | 0.4 |
| Example 18 | (45Ti—55Al) | CrS | AIP + MS | Yes | 1.6 |
| Example 19 | (50Ti—50Al) | WS$_2$ | AIP + MS | Yes | 3.9 |
| Example 20 | (34Ti—66Al) | WS$_2$ | AIP + MS | Yes | 6.8 |
| Example 21 | (50Ti—50Al) | CrS | AIP + MS | Yes | 4.4 |
| Example 22 | (50Ti—40Al—10Si) | WS$_2$ | AIP + MS | Yes | 0.9 |
| Example 23 | (40Ti—50Al—10Si) | NbS | AIP + MS | Yes | 7.6 |
| Example 24 | (50Ti—40Al—10Nb) | NbS | AIP + MS | Yes | 4.8 |
| Example 25 | (40Ti—50Al—10Nb) | WS$_2$ | AIP + MS | Yes | 0.3 |
| Example 26 | (50Ti—40Al—10Cr) | CrS | AIP + MS | Yes | 0.5 |
| Example 27 | (40Ti—50Al—10Cr) | WS$_2$ | AIP + MS | Yes | 1.4 |
| Example 28 | (60Cr—40Al) | WS$_2$ | AIP + MS | Yes | 2.0 |
| Example 29 | (40Cr—60Al) | CrS | AIP + MS | Yes | 1.8 |
| Com. Ex. 28 | (50Ti—50Al) | WS$_2$ | AIP + MS | No | 16.8 |
| Com. Ex. 29 | (45Ti—55Al) | NbS | AIP + MS | No | 15.0 |
| Com. Ex. 30 | (45Ti—55Al) | CrS | AIP + MS | Yes | 9.1 |
| Com. Ex. 31 | (50Ti—50Al) | WS$_2$ | AIP + MS | Yes | 15.8 |
| Com. Ex. 32 | (34Ti—66Al) | WS$_2$ | AIP + MS | No | 13.8 |
| Com. Ex. 33 | (50Ti—50Al) | CrS | AIP + MS | Yes | 14.0 |
| Com. Ex. 34 | (50Ti—40Al—10Si) | WS$_2$ | AIP + MS | No | —[3] |
| Com. Ex. 35 | (40Ti—50Al—10Si) | NbS | AIP + MS | No | —[3] |
| Com. Ex. 36 | (50Ti—40Al—10Nb) | NbS | AIP + MS | No | 7.0 |
| Com. Ex. 37 | (40Ti—50Al—10Nb) | WS$_2$ | AIP + MS | Yes | 14.5 |
| Com. Ex. 38 | (50Ti—40Al—10Cr) | CrS | AIP + MS | No | 15.5 |
| Com. Ex. 39 | (40Ti—50Al—10Cr) | WS$_2$ | AIP + MS | No | 16.0 |
| Com. Ex. 40 | (60Cr—40Al) | WS$_2$ | AIP + MS | No | 6.6 |
| Com. Ex. 41 | (40Cr—60Al) | NbS | AIP + MS | No | 13.8 |
| Conv. Ex. 5 | Two layers (TiN/MoS$_2$) | — | MS after AIP | — | — |
| Conv. Ex. 6 | Two layers (TiAlN/MoS$_2$) | — | MS after AIP | — | — |
| Conv. Ex. 7 | Two layers (TiAlCN/WS$_2$) | — | MS after AIP | — | — |

TABLE 3-continued

| | Target | | | Evaluation of Hard Coating | |
|---|---|---|---|---|---|
| No. | AIP (atomic %) | MS | Coating Method | S—O[1] | S Content[2] (atomic %) |
| Conv. Ex. 8 | Two layers (TiAlN/MoS$_2$) | — | MS after AIP | — | — |
| Conv. Ex. 9 | Two layers (TiAlN/MoS$_2$) | — | MS after AIP | — | — |
| Conv. Ex. 10 | (TiAl)N | — | AIP | — | — |
| Conv. Ex. 11 | (TiAlSi)N | — | AIP | — | — |

Note:
[1] The presence or absence of Si—O bonds in a surface layer.
[2] Maximum values measured by EPMA.
[3] The S content was less than a detection sensitivity of 0.1 atomic %.

TABLE 4

| No. | Structure | Difference in S Content | Crystal Lattice Stripes | Thickness per One Layer (nm) | Cuttable Length (m) |
|---|---|---|---|---|---|
| Example 16 | Columnar | Yes | Continuous | 73.1 | 48.0 |
| Example 17 | Columnar | Yes | Continuous | 37.5 | 59.0 |
| Example 18 | Columnar | Yes | Continuous | 66.6 | 50.0 |
| Example 19 | Columnar | Yes | Continuous | 89.4 | 45.0 |
| Example 20 | Columnar | Yes | Continuous | 16.5 | 61.0 |
| Example 21 | Columnar | Yes | Continuous | 96.8 | 42.0 |
| Example 22 | Columnar | Yes | Continuous | 77.3 | 59.0 |
| Example 23 | Columnar | Yes | Continuous | 48.1 | 55.0 |
| Example 24 | Columnar | Yes | Continuous | 4.4 | 67.0 |
| Example 25 | Columnar | Yes | Continuous | 58.7 | 51.0 |
| Example 26 | Columnar | Yes | Continuous | 22.8 | 60.0 |
| Example 27 | Columnar | Yes | Continuous | 8.2 | 63.0 |
| Example 28 | Columnar | Yes | Continuous | 30.4 | 59.0 |
| Example 29 | Columnar | Yes | Continuous | 2.8 | 64.0 |
| Com. Ex. 28 | Fine | Yes | Discontinuous | 7.4 | 9.0[1] |
| Com. Ex. 29 | Fine | Yes | Discontinuous | 88.9 | 12.0[1] |
| Com. Ex. 30 | Columnar | Yes | Continuous | 134.5 | 14.0[1] |
| Com. Ex. 31 | Fine | Yes | Discontinuous | 108.6 | 10.0[1] |
| Com. Ex. 32 | Fine | Yes | Discontinuous | 4.4 | 16.0[1] |
| Com. Ex. 33 | Fine | Yes | Discontinuous | 7.4 | 14.0[1] |
| Com. Ex. 34 | Columnar | —* | Continuous | 0.2 | —[2] |
| Com. Ex. 35 | Columnar | —* | Continuous | 0.8 | 0.2[3] |
| Com. Ex. 36 | Columnar | Yes | Continuous | 30.6 | 19.0[1] |
| Com. Ex. 37 | Fine | Yes | Discontinuous | 154.4 | 12.0[4] |
| Com. Ex. 38 | Fine | Yes | Discontinuous | 4.4 | 11.0[5] |
| Com. Ex. 39 | Fine | Yes | Discontinuous | 10.8 | 8.0[6] |
| Com. Ex. 40 | Columnar | Yes | Continuous | 33 | 20.0[1] |
| Com. Ex. 41 | Fine | Yes | Discontinuous | 2.7 | 15.0[7] |
| Conv. Ex. 5 | Columnar Only in TiN | No | Discontinuous TiN/MoS[14] | — | 6.0[8] |
| Conv. Ex. 6 | Columnar Only in TiAlN | No | Discontinuous TiAlN/MoS[14] | — | —[9] |
| Conv. Ex. 7 | Columnar Only in TiAlCN | No | Discontinuous TiAlCN/MoS[14] | — | —[10] |
| Conv. Ex. 8 | Columnar Only in TiAlN | No | Discontinuous TiAlN/MoS[14] | — | 8.0[11] |
| Conv. Ex. 9 | Columnar Only in TiAlN | No | Discontinuous TiAlN/MoS[14] | — | 2.0[12] |
| Conv. Ex. 10 | Columnar | No | Continuous | — | 16.3[13] |
| Conv. Ex. 11 | Columnar | No | Continuous | — | 20.2[13] |

Note:
[1] Broken.
[2] Because of large seizure, cutting was stopped.
[3] Because of large seizure at an early cutting stage, spark occurred.
[4] Because of large wear at an early cutting stage, the hard coating was broken.
[5] Because the hard coating peeled, evaluation was stopped.
[6] Because spark occurred, evaluation was stopped.
[7] Despite good cutting performance at an early stage, the hard coating + wore rapidly and was broken.
[8] After early peeling of MoS$_2$, the hard coating was broken.
[9] After early peeling of MoS$_2$, the hard coating was broken.

TABLE 4-continued

| No. | Structure | Difference in S Content | Crystal Lattice Stripes | Thickness per One Layer (nm) | Cuttable Length (m) |
|---|---|---|---|---|---|

(10)Because of early peeling of $WS_2$, evaluation was stopped.
(11)Because of early peeling of $MoS_2$, the hard coating was broken.
(12)Though evaluation was continued after the peeling of $MoS_2$, spark occurred.
(13)Peeling occurred by seizure at an early cutting stage.
(14)Interface.
*Could not be detected.

It is clear from Table 4 that the hard coatings of Examples 16-29 had a columnar structure. Each columnar crystal grain had a multi-layer structure comprising pluralities of layers having different S contents, and crystal lattice stripes are continuous in interlayer boundary regions. It is clear that inserts having hard coatings comprising layers each having a thickness T in a range of 0.1-100 nm have excellent cutting performance. It was confirmed that the existence of S—O bonds and the S content in a surface layer of the hard coating affect the cutting performance of a coated insert. The inserts having the hard coatings of Examples 16-29 could cut works whose cutting has conventionally been difficult.

Figure 6:
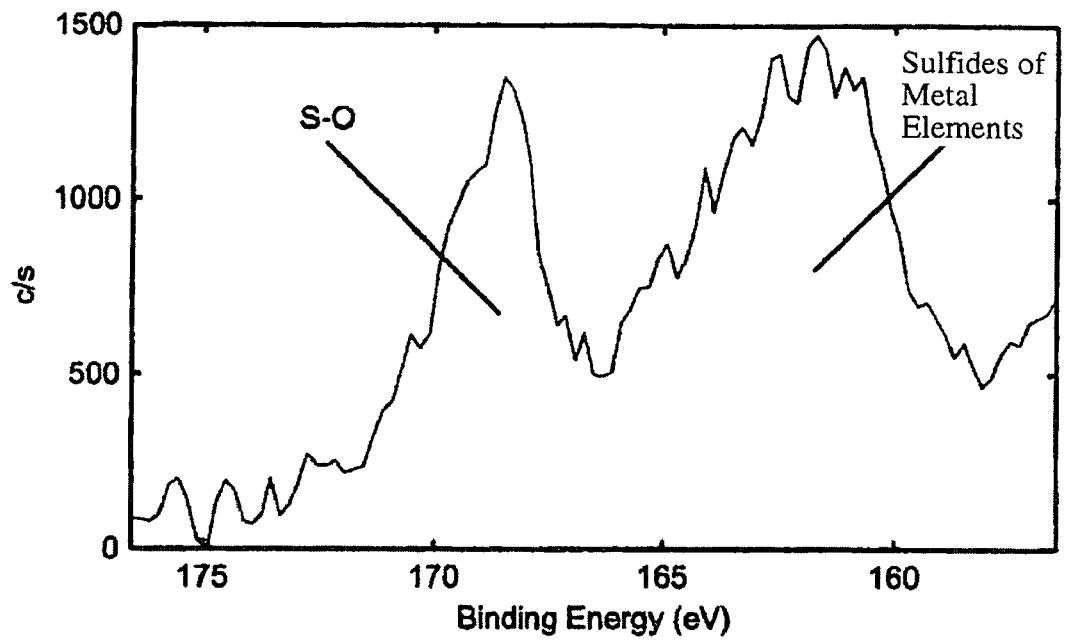
FIG. 6 is a graph showing XPS analysis results in Example 24.
Figure 7:
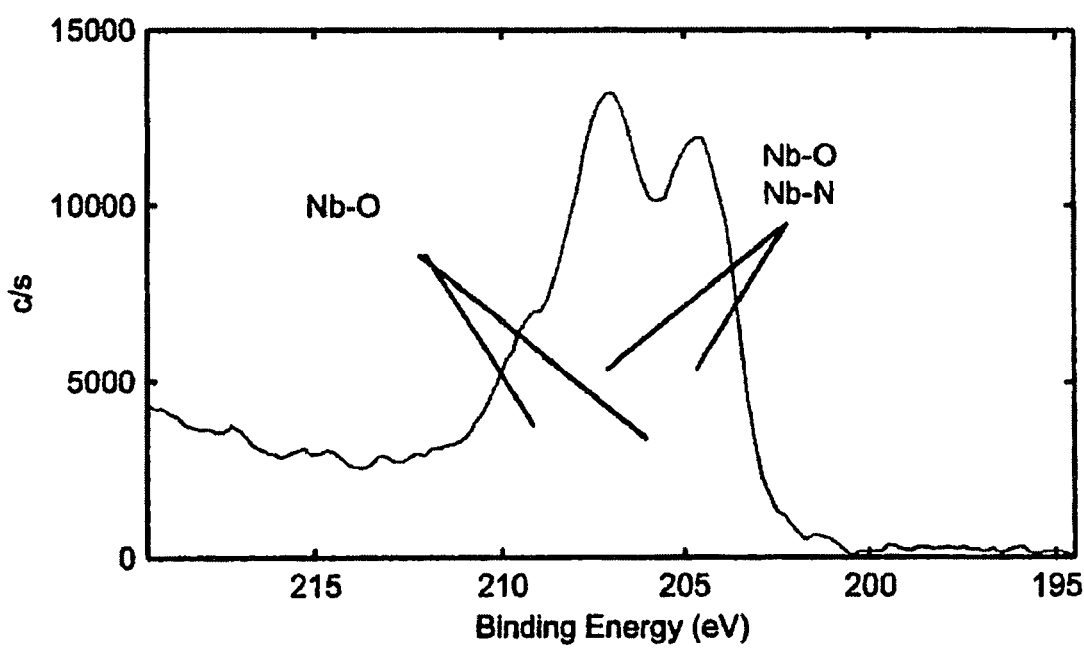
FIG. 7 is a graph showing XPS analysis results in Example 24.
Figure 8:
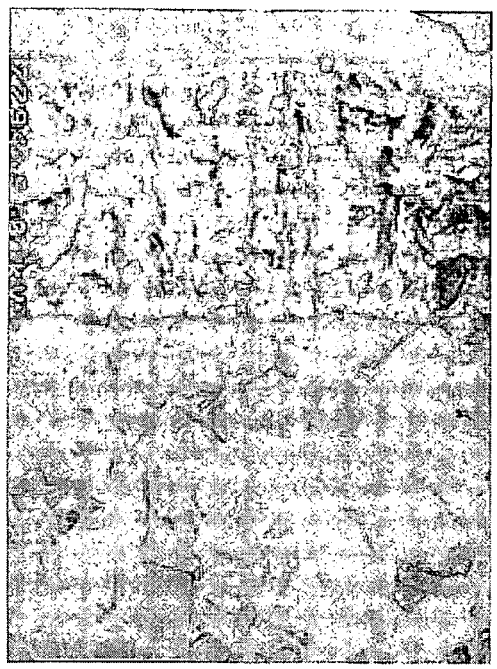
FIG. 8 is a transmission electron photomicrograph (magnification: 15,000) showing the structure of the hard coating of Example 24 on a fractured surface.

The hard coating of Example 24 containing S by using a target of NbS showed the best cutting performance. As shown in FIG. 6, the hard coating of Example 24 had S—O bonds in a range of 167-174 eV in XPS. It is considered that the existence of S—O bonds suppressed seizure at an early cutting stage. In addition to the S—O bonds, the existence of Nb-O bonds at 200-215 eV (FIG. 7) and metal sulfides at 161-164 eV (FIG. 6) was confirmed. Because sulfides and oxides having excellent lubrication were formed in a surface layer of the hard coating of Example 24, the seizure of a work metal was remarkably suppressed. In addition, because an MS target of NbS was used at a discharge output of 6.5 kW, the entire hard coating had an S content of 4.8 atomic %, within the range of the present invention. As shown in FIG. 8, It was confirmed by the observation of the structure of a fractured surface that the hard coating had a columnar structure. It was confirmed that the hard-coated inserts having such compositions and structure had excellent mechanical strength in a shear direction in cutting operations with severe impact, such as high-feed working, etc.

Figure 9:
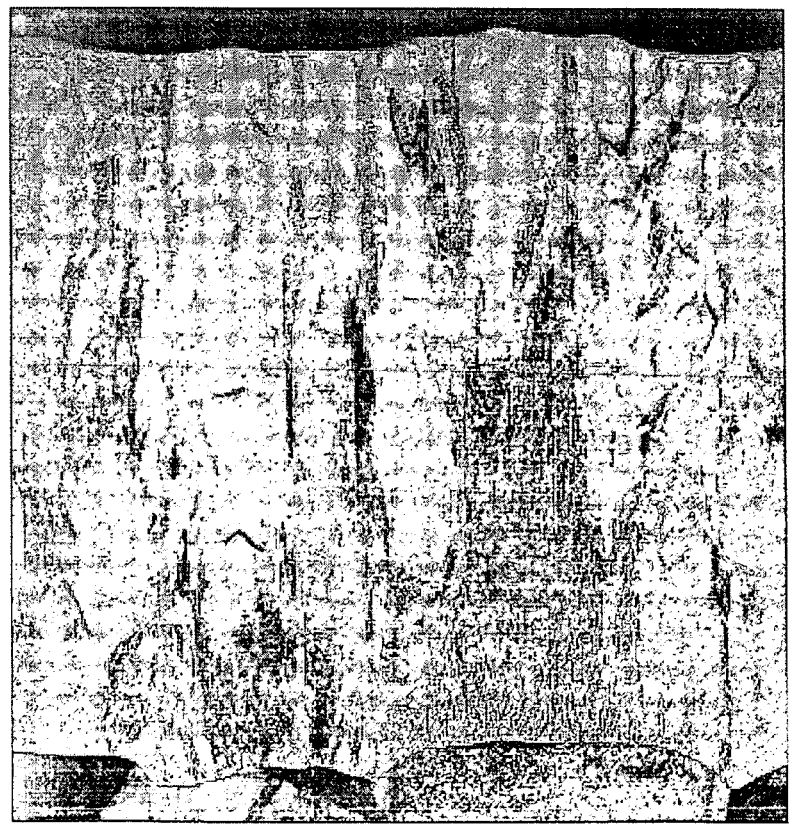
FIG. 9 is a transmission electron photomicrograph (magnification: 20,000) showing the structure of the hard coating of Example 24 on a fractured surface

It is clear from FIG. 9, a transmission electron photomicrograph (magnification: 20,000) of a fractured surface of the hard coating of Example 24, that each crystal grain in the hard coating having a columnar structure had a multi-layer structure. It is also clear from FIG. 10, a transmission electron photomicrograph (magnification: 200,000) of part of the crystal grain shown in FIG. 9, that the crystal grain had a multi-layer structure comprising pluralities of alternately laminated clear-contrast layers (black layers and gray layers). It was confirmed by electron diffraction that each crystal grain grew in substantially the same direction perpendicular to the substrate surface. It is clear from the stripe pattern shown in FIG. 10 that each layer was as thick as about 3-4 nm. Incidentally, the numbers of stripes are not equal between FIGS. 9 and 10 because of difference in magnification.

Figure 10:
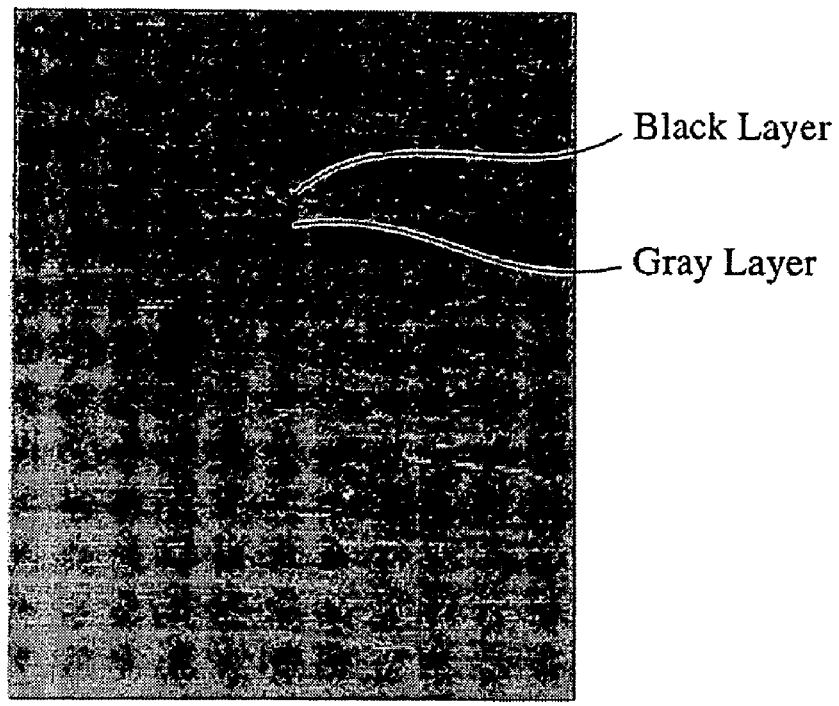
FIG. 10 is a transmission electron photomicrograph (magnification: 200,000) showing the structure of crystal grains in a region shown in FIG. 9.
Figure 11:
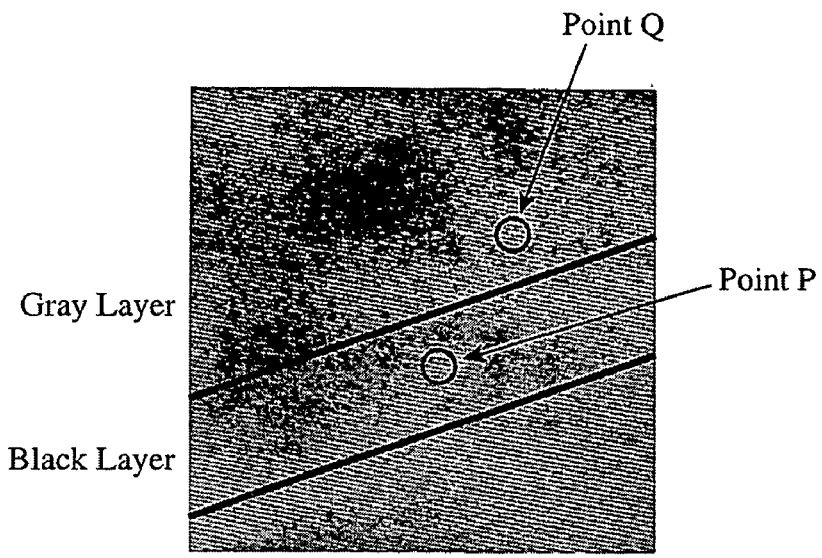
FIG. 11 is a transmission electron photomicrograph (magnification: 2000,000) showing black layers and gray layers in a region shown in FIG. 10.
Figure 12:
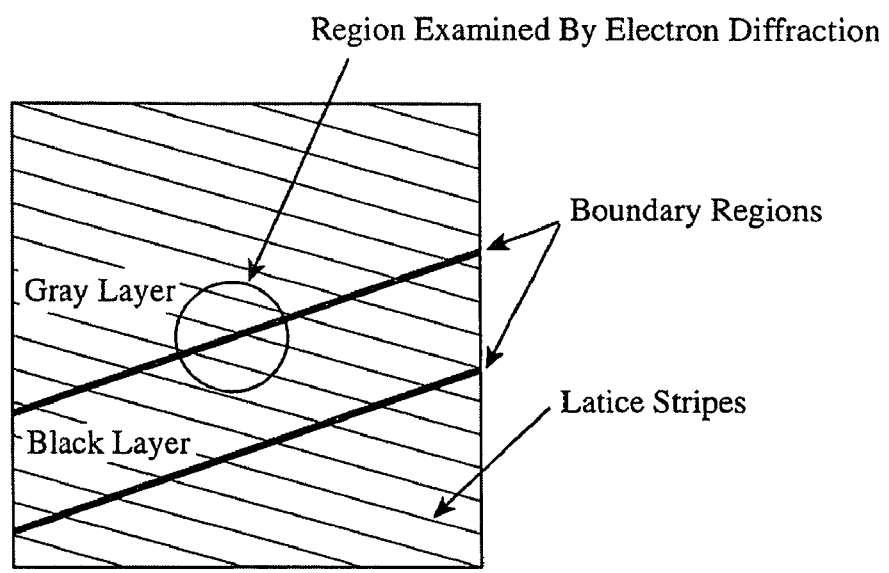
FIG. 12 is a schematic view corresponding to FIG. 11.

Part of the field of FIG. 10 was further observed by a magnification of 2,000,000, and the result is shown in FIG. 11. The observation region of FIG. 11 was magnified while confirming the positions of black layers and gray layers in FIG. 10, so that the black layers and the gray layers in FIG. 11 correspond to those in FIG. 10. Two lines depicted in FIG. 11 separate regions corresponding to the black layers and the gray layers. FIG. 12 is a schematic figure corresponding to the photograph of FIG. 11. It should be noted that the interval of lattice stripes is expanded for explanation. It is clear from FIG. 11 that crystal lattice stripes were continuous in interlayer boundary regions in the multi-layer structure; The crystal lattice stripes need not have continuity in all boundary regions, but there need only be regions having continuity in lattice stripes in a transmission electron photomicrograph. Though there is a black region on the left side of FIG. 11, this has nothing to do with the black layer shown in FIG. 10.

Figure 13:
FIG. 13 is an electron diffraction image of a region enclosed by a circle in FIG. 12.
Figure 14:
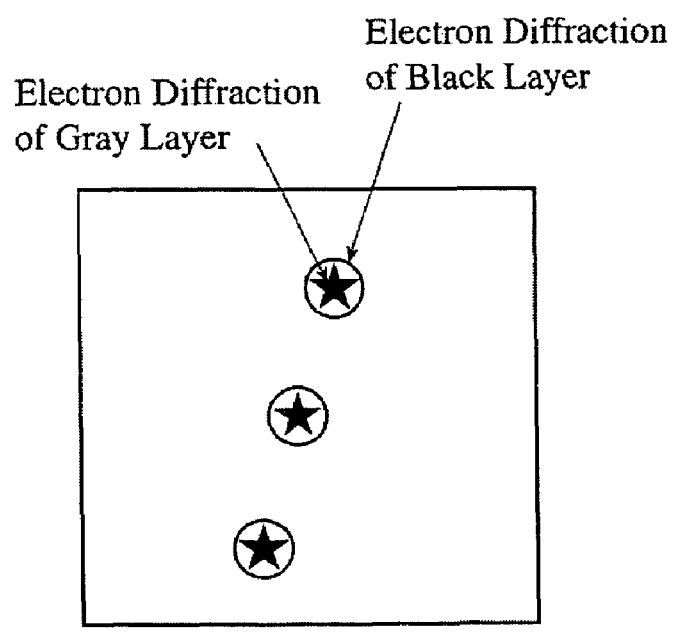
FIG. 14 is a schematic view corresponding to FIG. 13.

FIG. 13 shows an electron diffraction image of a region surrounded by a circle in FIG. 12, and FIG. 14 is a schematic view of FIG. 13. As is clear from FIGS. 13 and 14, the electron diffraction images of the black layers indicated by stars are substantially aligned with those of the gray layers indicated by circles, suggesting that the lattice stripes were continuous by an epitaxial relation in the boundary regions of the black layers and the gray layers. It is thus clear that the columnar crystal grains having a multi-layer structure are like a single crystal.

As the compositions of black layers and gray layers in the multi-layer columnar crystal grains in Example 24, the compositions at a point P (black layer) and a point Q (gray layer) in FIG. 11 were measured by an energy dispersive X-ray analyzer (EDX) attached to a transmission electron microscope. Table 5 shows the compositions of black layers and gray layers. Because the S content difference exceeding 10 atomic % makes the crystal structure fine, the S content difference should be controlled within 10 atomic %. In Example 24, because of the NbS discharge output of 6.5 kW, the S content difference was 4.0 atomic %.

TABLE 5

| Average Composition (atomic %) | Ti | Al | Nb | S |
|---|---|---|---|---|
| Black Layer | 45.4 | 40.0 | 11.8 | 2.8 |
| Gray Layer | 47.6 | 30.5 | 15.1 | 6.8 |

Figure 16:
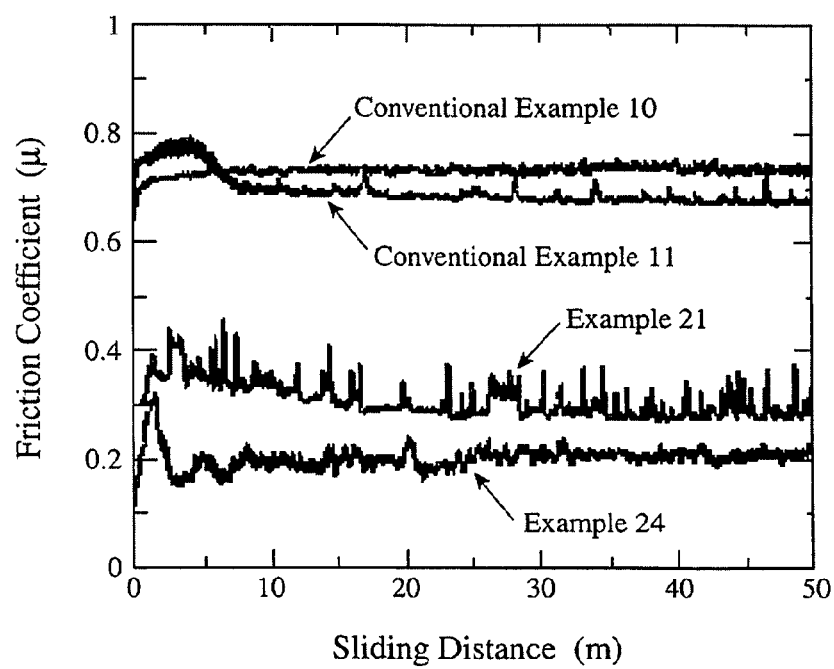
FIG. 16 is a graph showing the friction coefficients of Examples 21 and 24 and Conventional Examples 10 and 11.

FIG. 16 shows the friction coefficients of Examples 21 and 24 and Conventional Examples 10 and 11, which were measured as in Examples 1-15. FIG. 16 shows that the hard coatings of Examples 21 and 24 containing S had friction coefficients of 0.4 or less, exhibiting excellent lubrication.

To exhibit excellent cutting performance, NbS appears to be suitable for the target. Thus, the tools having the hard coatings of the present invention having excellent lubrication seizure provided satisfactory results even in working metals causing severe adhesion.

Using the coated insert of Example 24, which was best in the cutting test, intermittent cutting was conducted to a work with many drilled holes of 6 mm in diameter as in a die mold. As a result, stable cutting could be conducted without breakage even by severe impact. This appears to be due to the fact that the multi-layer structure comprising layers having proper thickness provides the hard coating with extremely improved toughness.

Figure 15:
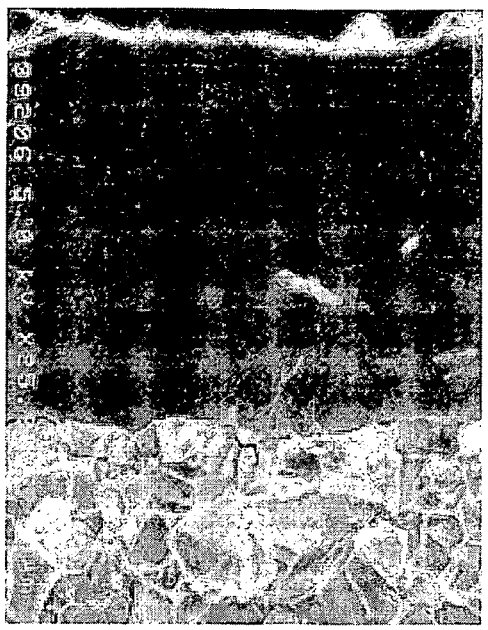
FIG. 15 is a transmission electron photomicrograph (magnification: 15,000) showing the structure of the hard coating of Comparative Example 33 on a fractured surface.

In Comparative Examples 28, 29, 31-33, 37-39 and 41, the S content was as much as more than 10 atomic %. Among them, the hard coating of Comparative Example 33 having an S content of 14 atomic % has an amorphous structure as shown in FIG. 15, with as low hardness as about 26 GPa, failing to exhibit a satisfactory cutting performance. To obtain mechanical strength withstanding severe use, it is important to control the S content properly.

The hard coating of Comparative Example 30 had S—O bonds in a surface layer, with an S content of 9.1 atomic %, within the range of the present invention. However, because each layer in the hard coating formed by simultaneous discharge of AIP and MS (discharge output of an MS target was 6.6 kW) has a thickness more than 100 nm, the crystal lattice stripes of each layer had strain with discontinuity in interlayer regions, and thus the hard coating had a fine crystal structure. Accordingly, the coated insert of Comparative Example 30 wore early.

The hard coating of Comparative Example 36 had no S—O bonds despite the inclusion of S, because O was not added to a reaction gas. This indicates that though the addition of S improves cutting performance, it is insufficient to suppress seizure, which tends to occur at an early cutting stage. Because the discharge output of $WS_2$ and NbS was as low as 1 kW in Comparative Examples 34 and 35, the one-layer thickness in their multi-layer structures was 0.2 nm and 0.8 nm, respectively, and their S contents were as small as undetectable by XPS analysis. Therefore, they suffered severe seizure at an early cutting stage. Particularly in Comparative Example 35, spark occurred, stopping the cutting evaluation. This indicates the importance of controlling the content and bonding state of S in the hard coating, and one-layer thickness corresponding to a lamination period.

As described above, the hard coating of the present invention has excellent oxidation resistance, wear resistance, lubrication, adhesion to a substrate, impact resistance and breakage resistance. Accordingly, a cutting tool having the hard coating of the present invention can stably conduct not only high-efficiency dry cutting but also intermittent cutting to die-casting mold steel causing severe seizure, enjoying a long life.

What is claimed is:

1. A multi-layer, hard coating formed on a substrate surface, said hard coating comprising at least one metal element selected from the group consisting of transition metal elements of Groups 4a, 5a and 6a in the Periodic Table, Al, Si and B (at least one of said transition metal elements is indispensable), and at least one non-metal element selected from the group consisting of S, O, N and C (S is indispensable), and having a columnar structure, in which crystal grains have a multi-layer structure having pluralities of layers having different S contents, wherein differences between average Si contents $Si_A$ in layers having larger Si contents and average Si contents $Si_B$ in layers having smaller Si contents are 0.2-5 atomic %.

2. The hard coating according to claim 1, having a composition comprising metal components represented by $Al_wTi_xM_ySi_z$, wherein M is at least one transition metal element of Groups 4a, 5a and 6a in the Periodic Table, and w, x, y and z meet the conditions of $20 \leq w \leq 50$, $25 \leq x \leq 75$, $2 \leq y \leq 20$, $0.01 \leq z \leq 10$, $w+x+y+z=100$, and $w \leq x+y+z$, by atomic %, and non-metal components represented by $O_aS_bN_{100-a-b}$, wherein a and b meet the conditions of $0.3 \leq a \leq 5$, and $0.1 \leq b \leq 5$, by atomic %, said hard coating having a friction coefficient of 0.4 or less, and Si—O bonds near surface, a (200) plane of said hard coating being in a hetero-epitaxial relation with a (100) plane of said substrate.

3. The hard coating according to claim 2, wherein M is Mo.

4. The hard coating according to claim 2, wherein an atomic ratio of the total amount of said non-metal elements to the total amount of said metal elements is more than 1.0.

5. The hard coating according to claim 4, wherein an atomic ratio of the total amount of non-metal elements to the total amount of metal elements is 1.02-1.7.

6. The hard coating according to claim 5, wherein said Si—O bonds are in a range of 100-105 eV by ESCA.

7. The hard coating according to claim 4, wherein said Si—O bonds are in a range of 100-105 eV by ESCA.

8. The hard coating according to claim 3, wherein an atomic ratio of the total amount of said non-metal elements to the total amount of said metal elements is more than 1.0.

9. The hard coating according to claim 3, wherein said Si—O bonds are in a range of 100-105 eV by ESCA.

10. The hard coating according to claim 2, wherein said Si—O bonds are in a range of 100-105 eV by ESCA.

11. The hard coating according to claim 1, which has a ratio Ib/Ia of 2.0 or more, wherein Ia and Ib are peak intensities of (111) and (200) planes, respectively, of a face-centered cubic structure measured by X-ray diffraction, said (200) plane having a lattice constant λ of 0.4155-0.4220 nm.

12. The hard coating according to claim 1, whose surface is made flat by machining.

13. A tool having the hard coating recited in claim 1.

14. The hard-coated tool according to claim 13, wherein an intermediate layer comprising at least one selected from the group consisting of nitrides, carbonitrides and boronitrides of Ti, TiAl alloys, Cr and W is formed on a surface of said substrate.

15. A hard coating formed on a substrate by physical vapor deposition comprising at least one metal element selected from the group consisting of transition metal elements of Groups 4a, 5a and 6a in the Periodic Table, Al, Si and B (at least one of said transition metal elements is indispensable), and at least one non-metal element selected from the group consisting of S, O, N and C, S being indispensable, wherein said hard coating has a columnar structure, and comprises crystal grains which have a multi-layer structure wherein the multi-layer structure comprises a plurality of layers having different S contents, wherein S—O bonds are present on a surface of the crystal grains and the peak of the S—O bonds on the surface is detected in a range of 167-170 eV by electron spectroscopy.

16. The hard coating according to claim 15, whose surface is made flat by machining.

17. A tool having the hard coating recited in claim 15.

18. The hard coating according to claim 15, having an S content of 0.1-10 atomic %.

19. A hard coating formed on a substrate surface by physical vapor deposition, which comprises at least one metal element selected from the group consisting of transition metal elements of Groups 4a, 5a and 6a in the Periodic Table, Al, Si and B (at least one of said transition metal elements is indispensable), and at least one non-metal element selected from the group consisting of S, O, N and C, S being indispensable, wherein said hard coating has a columnar structure comprising crystal grains having a multi-layer structure where the multi-layer structure comprises a plurality of layers having different S contents with interlayer boundary regions existing in the crystal grains in which crystal lattice stripes are continuous, wherein each layer of the multi-layer structure has a thickness of 0.1-100 nm.

20. The hard coating according to claim 9, having S—O bonds.

21. The hard coating according to claim 20, having an S content of 0.1-10 atomic %.

22. The hard coating according to claim 9, having an S content of 0.1-10 atomic %.

23. The hard coating according to claim 9, whose surface is made flat by machining.

24. A tool having the hard coating recited in claim 9.

* * * * *